United States Patent
Rendler et al.

(10) Patent No.: US 12,495,622 B2
(45) Date of Patent: Dec. 9, 2025

(54) SOLAR-CELL MODULE

(71) Applicant: Fraunhofer-Gesellschaft zur Förderung der angewandten Forschung e.V., Munich (DE)

(72) Inventors: Li Carlos Rendler, Freiburg (DE); Christian Reichel, Freiburg (DE); Christoph Kutter, Freiburg (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 18/715,833

(22) PCT Filed: Dec. 2, 2022

(86) PCT No.: PCT/EP2022/084294
§ 371 (c)(1),
(2) Date: Jun. 3, 2024

(87) PCT Pub. No.: WO2023/099771
PCT Pub. Date: Jun. 8, 2023

(65) Prior Publication Data
US 2025/0072122 A1    Feb. 27, 2025

(30) Foreign Application Priority Data
Dec. 3, 2021   (DE) .......................... 102021131977.3

(51) Int. Cl.
*H10F 19/90*   (2025.01)
*H10F 19/40*   (2025.01)
*H10F 19/75*   (2025.01)

(52) U.S. Cl.
CPC ........... *H10F 19/902* (2025.01); *H10F 19/40* (2025.01); *H10F 19/75* (2025.01)

(58) Field of Classification Search
CPC .......... H10F 19/40; H10F 19/70; H10F 19/75; H10F 19/902; H02S 40/34
See application file for complete search history.

(56) References Cited

U.S. PATENT DOCUMENTS 9,935,222 B1 *   4/2018   Zhou ...................... H02S 40/36
2015/0349176 A1   12/2015   Morad et al.
(Continued)

FOREIGN PATENT DOCUMENTS

CN        110581196 A       12/2019
DE    102005012213 B4        1/2009
(Continued)

OTHER PUBLICATIONS

DE 10 2011 055 754 A1 English translation provided by FIT database, translated on May 13, 2025.*

*Primary Examiner* — Golam Mowla
(74) *Attorney, Agent, or Firm* — Volpe Koenig

(57) ABSTRACT

A solar cell module, having at least one first module segment, wherein the first module segment includes a first subsegment and at least one second subsegment, the first and the second subsegment each have at least one solar cell string and each solar cell string has a plurality of solar cells interconnected in series. The first module segment includes a first and an at least second bypass element and bypass connectors. These bypass elements are interconnected via the bypass connectors within the module segment. The shading properties, the electrical characteristics and the material expenditure in the production of the solar module are advantageously adapted via advantageous circuit and geometry arrangements of the elements.

16 Claims, 15 Drawing Sheets

(56) References Cited

U.S. PATENT DOCUMENTS

2015/0349701 A1  12/2015  Morad et al.
2016/0226438 A1   8/2016  Gibson et al.
2016/0226439 A1   8/2016  Gibson

FOREIGN PATENT DOCUMENTS

| DE | 102009060604 A1 | 6/2011 |
| DE | 102012207168 B4 | 2/2016 |
| DE | 102011055754 B4 | 12/2022 |
| EP | 3783670 A1 | 2/2021 |
| WO | 2015001413 A1 | 1/2015 |

* cited by examiner map 1:

map 2:

map 3:

map 4:

SOLAR-CELL MODULE

CROSS-REFERENCE TO RELATED APPLICATIONS

This application is a 371 National Phase of PCT/EP2022/084294, filed Dec. 2, 2022, which claims priority from German Patent Application No. 10 2021 131 977.3, filed Dec. 3, 2021, both of which are incorporated herein by reference as if fully set forth.

TECHNICAL FIELD

The invention relates to a solar cell module.

BACKGROUND

Solar cells are sensitive semiconductor components. To protect them from environmental influences in the long-term and achieve manageable electrical output parameters, solar cells are typically electrically interconnected and encapsulated in a module structure.

Partial shading, in which individual solar cells are entirely or partially shaded, for example, by soiling or by objects which cast shade on the solar cell module, is problematic in the use of solar cell modules. In the event of partial shading, on the one hand, the electrical output power of the entire solar cell module can be significantly reduced or drop to zero. On the other hand, partial shading can result in significant heating of the partially-shaded solar cell, so that the risk of damage to the solar cell and the module structure arises. Therefore, interconnecting bypass diodes in parallel to multiple solar cells is known, so that in case of partial shading in a subsection of the solar cell module, the solar cells in this subsection are bypassed via the bypass diode.

A solar cell module therefore typically comprises multiple module segments, wherein each module segment has at least one solar cell string. This solar cell string comprises multiple solar cells connected in series.

Different configurations of module segments of a solar cell module are known from US 2016/0226439 A1, wherein a bypass diode connected in parallel is assigned to each module segment. A solar cell module having multiple module segments and bypass diodes arranged centrally in the solar cell module is known from WO2015/001413.

A solar cell module having multiple module segments is known from DE1020201280807, which upon shading of solar cells of the solar cell module at an arbitrary edge of the module does not result in total failure of the solar cell module.

SUMMARY

The present invention is based on the object of adapting, with little additional material expenditure, the number of the solar cells in a string which are secured via a bypass diode, for a structure which nonetheless does not result in total failure of the solar cell module upon shading of solar cells of the solar cell module even in a non-peripheral subsection of the module. Moreover, the component area requirement in relation to the total module area is reduced by this structure and the area performance density of the solar module is therefore increased.

This object is achieved by a solar cell module having one or more of the features disclosed herein. Advantageous embodiments are found in the description and claims that follow.

The solar cell module according to the invention comprises at least one first module segment having a first subsegment and at least one second subsegment. The subsegments comprise at least one solar cell string. Each of the solar cell strings is composed of a plurality of solar cells interconnected in series.

The subsegments comprise a first electrical pole and a second electrical pole. The two subsegments of the first module segment are interconnected in series via subsegment connectors. It is essential in this case that the first module segment comprises a plurality of bypass elements, at least a first and a second bypass element. Moreover, it is essential that the first pole of the first bypass element of the first module segment is electrically conductively connected to the first pole of the first subsegment of the first module segment and that the second pole of the second bypass element of the first module segment is electrically conductively connected to the second pole of the second subsegment of the first module segment.

In addition to this essential connection, the second pole of the first bypass element of the first module segment and the first pole of the second bypass element of the first module segment are electrically conductively connected by means of a bypass connector to the subsegment connector of the first module segment.

In addition to the first module segment, the solar cell module comprises another, second module segment. This second module segment, like the first module segment, also comprises a first at least one second bypass element. It is essential in this case that the first pole of the first bypass element of the second module segment is connected to the first pole of the first subsegment of the second module segment. Moreover, it is essential that the second pole of the second bypass element of the second module segment is electrically conductively connected to the second pole of the second subsegment of the second module segment and the second pole of the first bypass element of the second module segment and the first pole of the second bypass element of the second module segment are electrically conductively connected by means of a bypass connector to the subsegment connector of the second module segment. Moreover, it is essential that the first and the second module segment are connected indirectly or directly, preferably directly in series or that the first and the second module segment are connected indirectly or directly, preferably directly in parallel.

In contrast to previously known configurations, the solar cell module according to the invention therefore comprises at least two module segments connected in series or in parallel, each of which comprises at least two subsegments, wherein the two subsegments are each secured from partial shading by a bypass element interconnected in parallel to these two module segments, wherein this parallel interconnection of the bypass elements is embodied via a bypass connector.

In the majority of the configurations known from the prior art, it is necessary for a bypass element to be electrically interconnected to two opposing ends of a module segment in order to achieve a parallel circuit. This requires connecting lines for the bypass element, which typically have to have the length of a module segment, in particular at least the length of a solar cell string of the module segment.

The solar cell module according to the invention enables an arrangement of the bypass elements and subsegments so that at least a first and a second bypass element may be connected via a bypass connector to a common subsegment connector. It is advantageous in this case that due to the connection by means of bypass connectors, there is a reduction of the material expenditure because of the combination of the otherwise required individual connections of the bypass elements to the subsegment connector. Via such connectors it is possible to secure small-part subsegments using a bypass in order to reduce partial shading losses. Moreover, the use of a bypass connector enables a more flexible arrangement of the bypass elements on the solar module. It is moreover advantageous that the component area requirement is reduced in relation to the total module area by this construction and therefore the area performance density of the solar module is increased.

In one advantageous embodiment, the bypass connectors are arranged between the first and the second subsegment of the respective module segment, in particular in the middle between the first and the second subsegment of the respective module segment. The bypass connectors of the respective module segment are advantageously arranged in a middle area which the subsegments of the respective module segment adjoin.

One advantage of this embodiment is the short connecting lines for interconnecting the bypass elements with the respective subsegments. This also applies for the advantageous embodiment with respect to the short connecting lines of the module segments and the bypass elements, so that the bypass connectors between the first and the second module segment are in particular arranged in the middle between the first and the second module segment. The bypass connectors of the respective module segment are advantageously arranged in a middle area which module segments adjoin.

An advantageously structurally simple design results in one embodiment in which a subsegment connector for the series connection of the subsegments is arranged between the first and the second subsegment of a module segment, which comprises an additional contact point for connecting a bypass connector, by which poles of multiple, in particular two bypass elements are conductively connected to the subsegment connector.

The advantage results in this way that the subsegment connector can be used, on the one hand, for the series connection of subsegments and, on the other hand, as a contact point for bypass element connectors.

An advantageously structurally simple design results in one advantageous embodiment in which at least one segment connector for the series connection of the module segments is arranged between a first and a second module segment.

The advantage results in this way in a series circuit of module segments that only a short connector is required as the segment connector.

In a refined advantageous embodiment, at least one segment connector is used for the parallel connection of a first and a second module segment.

This embodiment has the advantage that in a parallel interconnection by means of at least one segment connector, the resulting overall voltage across a solar module is lower in contrast to a series circuit by means of segment connectors.

An embodiment particularly optimized for partial shading results in an advantageous refinement in which a first and a second module segment, which are connected by means of segment connectors, are arranged adjacent to one another in a longitudinal arrangement which is perpendicular to the alignment of the solar cell strings.

In this case, in case of shading along the short edge of the solar module, only the respective affected string of a subsegment of a module segment fails. The performance in specific shading scenarios thus increases and the yield of the overall system is potentially higher than in conventional solar module layouts. A further advantage in addition to the shading tolerance is provided by the short length of the solar cell strings, which are each secured using a bypass element. Moreover, the area utilization is improved.

The effectiveness of this embodiment is improved by a further advantageous refinement. The solar cell strings of the solar cell module are arranged in this case in such a way that the solar cell module has a shorter edge and a longer edge and that the solar cell strings of a subsegment are arranged parallel to the short edge within the solar cell module along a linear row.

The solar cell strings of a subsegment of a module segment advantageously comprise the same number of solar cells. This enables in a simple manner all subsegments to supply the same electrical voltage under standard conditions, so that no mismatch arises and therefore no loss due to different voltages of the individual subsegments.

Moreover, it is advantageous that the individual module segments of a solar module comprise the identical number of solar cell strings and the solar cell strings each comprise the identical number of solar cells. This also enables in a simple manner all module segments to supply the same amperage under standard conditions, so that no mismatch arises and therefore no loss due to different amperages of the individual module segments. Moreover, the advantage results that all bypass elements of an equal number of solar cells connected in series are connected in parallel. Therefore, identical or similar bypass elements can be used.

The subsegments of a module segment advantageously lie in a plane and the bypass elements of the respective module segment are arranged spaced apart from this plane.

This advantage is due to the simple positioning of the bypass elements in junction boxes on the rear side of the module and the area performance density thus increased. It is within the scope of the invention that the element positioning can also take place in laminate-integrated form.

In one advantageous embodiment, dual-junction/tandem solar cells (4-terminal) are used. In this embodiment, individual layers are embodied as module segments which are arranged in stacks, these module segment stacks are arranged so that the solar cells of the solar cell string of the subsegment of a module segment and the solar cells of the solar cell string of a subsegment of a further module segment are arranged one over another. The above-described advantages are therefore combined with the advantages of the use of multilayered structures in the form of tandem solar cells such as the better utilization of the incident light spectrum via the use of solar cell combinations made of multiple materials.

The above-described module segment stack embodiment is advantageously electrically conductively connected to form multiple module segment stack groups via a module segment stack connector, so that the module segment stacks are oriented adjacent to one another in a longitudinal arrangement which is perpendicular to the alignment of the solar cell string extension. In a further advantageous embodiment, the module stack connector is positioned inside a junction box.

The advantage results in this way that the module segment stack connector for the series connection of module segments only requires a short connector. In a further advantageous embodiment, the module segments are positioned stacked in an arrangement and these module segment stacks are arranged so that the solar cells of the solar cell string of the subsegment of one module segment and the solar cells of the solar cell string of a subsegment of a further module segment are arranged one over another.

The shingle arrangement form is advantageously electrically conductively connected to multiple module segment stack groups via a module segment stack connector so that the module segment stacks are oriented adjacent to one another in a longitudinal arrangement which is perpendicular to the alignment of the solar cell string extension.

In a further advantageous embodiment, the module stack connector is not directly embodied as a component. The function of the module stack connector is assumed via an electrically conductive adhesive, which, in addition to the electrically conductive connection, implements a mechanical connection of the module stacks. The adhesive establishes a front to rear side connection of the respective module segments.

Above all the reduction of electrical losses within the solar module is advantageous in this embodiment.

In one advantageous embodiment, the first and the second subsegment of a module segment are arranged in parallel to one another and are electrically connected in series at a first edge area, in particular by means of a subsegment connector, preferably by means of a linear subsegment connector. The parallel arrangement of the subsegments is advantageous, since an ideal area utilization of the solar cell module is thus implemented.

In one advantageous embodiment, all bypass elements of a module segment are arranged peripherally on a peripheral area of the solar cell module. The peripheral arrangement of the bypass elements is advantageous since an improved area utilization of the solar cell module is thus achieved and the bypass elements can be arranged in at least one peripheral junction box on the rear side of the solar cell module.

In one advantageous embodiment, the length of the bypass connector is less than 250 cm, preferably less than 150 cm, particularly preferably less than 130 cm and/or is greater than 30 cm, preferably greater than 80 cm. The length specification of the bypass connector has the advantage that the routine solar module format dimensions are thus covered.

With respect to the arrangement of the bypass connectors, there is an advantageous embodiment in which the bypass connectors of a module segment are on a first level and the solar cells of the respective module segment are in a second level which is spaced apart from the first level and insulation is arranged between the first and second levels.

The advantage of this arrangement is that no additional area has to be used for the bypass connector in the geometrical arrangement of the solar cells or the solar cell strings. The footprint shrinks and the area performance density of the solar module is increased in this case.

In a further advantageous embodiment, the solar cells and/or the solar cell module have a rectangular shape having an aspect ratio greater than one. The advantage in this case is that the routine form factor of a typical solar module is preserved.

In a particularly advantageous embodiment, a first and a second module segment are each additionally expanded by a subsegment and a third module segment. This third module segment is arranged between the first and the second module segment. The first and the second module segment each comprise a third bypass element. The subsegments are arranged parallel to one another in four subsegment pairs. The three bypass elements of the first module segment are arranged in the middle between the first and second subsegment pair of the module, the bypass elements are particularly preferably arranged in a middle area adjoined by the three subsegments of the first module segment. The first and second bypass element of the third module segment are arranged in the middle between the first subsegment and the second subsegment of the third module segment, particularly preferably arranged so that the bypass elements are arranged in a middle area adjoined by the two subsegments of the third module segment and the second subsegment of the first module segment and the first subsegment of the second module segment. The bypass elements of the second module segment are arranged in the middle between the third and fourth subsegment pair of the module, particularly preferably are arranged so that the bypass elements are arranged in a middle area adjoined by the three subsegments of the second module segment.

The advantage of this particularly advantageous embodiment is the interconnection of a further module segment between two existing module segments and the supplementation of the existing ones by a further subsegment and a bypass element and the easily scalable expansion of multiple module segments to form a larger solar module having increased output performance.

The number of solar cells of each solar cell string of the first and second module segment is advantageously in the range of 5 to 65 solar cells.

Solar cells having identical performance data in the scope of the typical manufacturing tolerances, in particular identical voltage and amperage at the optimum operating point under standard conditions, are advantageously used for all subsegments.

The number of the solar cell strings of the subsegments is advantageously in the range of 2 to 8 solar cell strings per subsegment.

The advantage results in this way that a desired output amperage upon standard illumination is selectable by a corresponding number of the solar cell strings for each module segment.

It is within the scope of the invention that the solar cells of a solar cell string are interconnected in series using methods known per se. In particular, the solar cells can be arranged in shingle technology, so that two adjacent solar cells are arranged overlapping and the electrical contact of the two solar cells for the series interconnection is formed in the overlap area.

An overlapping arrangement of the solar cells of a string is also within the scope of the invention, wherein the solar cells are electrically connected in series by means of at least one cell connector. Such an arrangement is called a "negative gap" arrangement.

However, to simplify the production process and to use established known methods for producing solar cell strings, it is advantageous that according to one advantageous embodiment each two adjacent solar cells of a solar cell string are electrically interconnected using at least one, preferably using at least two, in particular at least three cell connectors in order to form the series interconnection of the solar cells. It is within the scope of the invention that metallic elements having rectangular, round cross section or having structured surface are used as cell connectors.

As described at the outset, a module segment is distinguished in that a module segment comprises at least one solar cell string. If a module segment comprises multiple solar cell strings, these solar cell strings are preferably interconnected in parallel. The solar cell strings are advantageously exclusively interconnected in parallel in each of the subsegments. A structurally simple design results in this way.

Advantageously, each module segment, in particular each subsegment, comprises at least two solar cell strings connected in parallel in order to achieve a higher amperage in comparison to solar cells only connected in series. In particular, it is advantageous that each subsegment comprises precisely two or precisely three solar cell strings connected in parallel.

The bypass elements can be designed in a way known per se, in particular, the design of the bypass diodes as diodes, in particular Schottky diodes, as MOSFETs, or as an electronic switching unit and/or integrated circuits, in particular according to DE 102005012213 A1 and/or DE 10 2009 060 604 A1 is also within the scope of the invention. Each bypass element is advantageously connected to the same number of solar cells, in particular connected in parallel to the same number of solar cells. In particular, each bypass element is advantageously connected to the same number of solar cell strings, in particular connected in parallel. This is advantageous since thus all bypass elements of the module have the same requirements for the occurring voltages and currents and thus bypass elements having the same optimum parameters can be used.

In one advantageous embodiment, the solar cell module has a mirror plane. At least the spatial arrangement of the solar cells and preferably the spatial arrangement of the bypass elements is designed mirror symmetrically with respect to the mirror plane. It is within the scope of the invention that the electrical arrangement of the solar cells (arrangement of the positive and negative terminals of the solar cell via which the solar cell is connected in series to the adjacent solar cell) is not formed mirror symmetrically to the mirror plane.

In one advantageous embodiment, the first module segment is mirrored along a vertical mirror plane and this module segment mirroring is interconnected by means of a segment connector to the module segment, wherein the electrical alignment of the solar cells is uniform in the module segment and in the module segment mirroring and is thus not subject to mirroring at the mirror plane.

In one advantageous embodiment, the second module segment represents a translational displacement of the first module segment with respect to the spatial arrangement of at least the solar cells and bypass elements, particularly preferably a translational displacement perpendicular to an extension direction of the solar cell strings of the first module segment. This advantageously applies for all module segments.

At least one, preferably all further subsegments of the solar cell module represent a translational displacement with respect to the spatial arrangement of at least solar cells and bypass elements.

It is likewise within the scope of the invention that the electrical arrangement of the solar cells is also formed mirror symmetrically to the mirror plane.

In one advantageous embodiment, all solar cell strings of the solar cell module extend spatially parallel to an extension direction and the solar cell module has a mirror plane extending parallel to the extension direction and perpendicular to the solar cell module, which represents a mirror plane at least for the spatial arrangement of the solar cells, the solar cell strings, and the bypass diodes.

The mirror plane is preferably perpendicular to the module plane (to the planar extension of the module). The mirror plane is advantageously arranged parallel to a longitudinal extension of the solar cell strings. The solar cell module advantageously has precisely one mirror plane.

The solar cell module advantageously has a laminate, in which at least one, preferably all bypass elements are integrated.

It is within the scope of the invention that the solar cell module is structurally designed in a way known per se. In particular, it is within the scope of the invention that the solar cells of the solar cell module are arranged on a carrier plate and an optically transparent cover layer known per se for encapsulating the solar cells is arranged on the side facing toward the incident light during use. Furthermore, electrical contacts for interconnecting the solar cell module in a circuit are preferably arranged on the rear side on the solar cell module, in particular for interconnection with further solar cell modules.

It is within the scope of the invention to use solar cells known per se for converting incident radiation into electrical energy, in particular to use solar cells which cover more than two band gaps.

In particular, the use of partial solar cells, which result by dividing a larger base solar cell, in particular half or third cells as solar cells is within the scope of the invention.

The solar cells can comprise as the absorbent material a semiconductor material and one or more pn-transitions for separating the charge carriers. Furthermore, it is within the scope of the invention that solar cells based on materials from the III and V main groups of the periodic system (so-called III/V solar cells) or solar cells based on perovskite are used in particular in combination with other materials.

Photovoltaic solar cells, in particular photovoltaic solar cells based on a silicon substrate, are advantageously used to form the solar cell strings. Solar cells which are known per se and available on the market can be used in this way.

It is within the scope of the invention to use bifacial solar cells to form the solar cell strings. Such solar cells are designed for light absorption from the front and rear sides of the solar cell. In this embodiment, the solar cell module preferably has optically transparent layers on the front side and on the rear side of the solar cell module, so that radiation, in particular sunlight, is incident on the solar cells through the encapsulation layers of the solar cell module both from the front side and from the rear side of the solar cell module.

BRIEF DESCRIPTION OF THE DRAWINGS

Further preferred features and embodiments are explained hereinafter on the basis of exemplary embodiments and figures.

DETAILED DESCRIPTION

Figure 1:
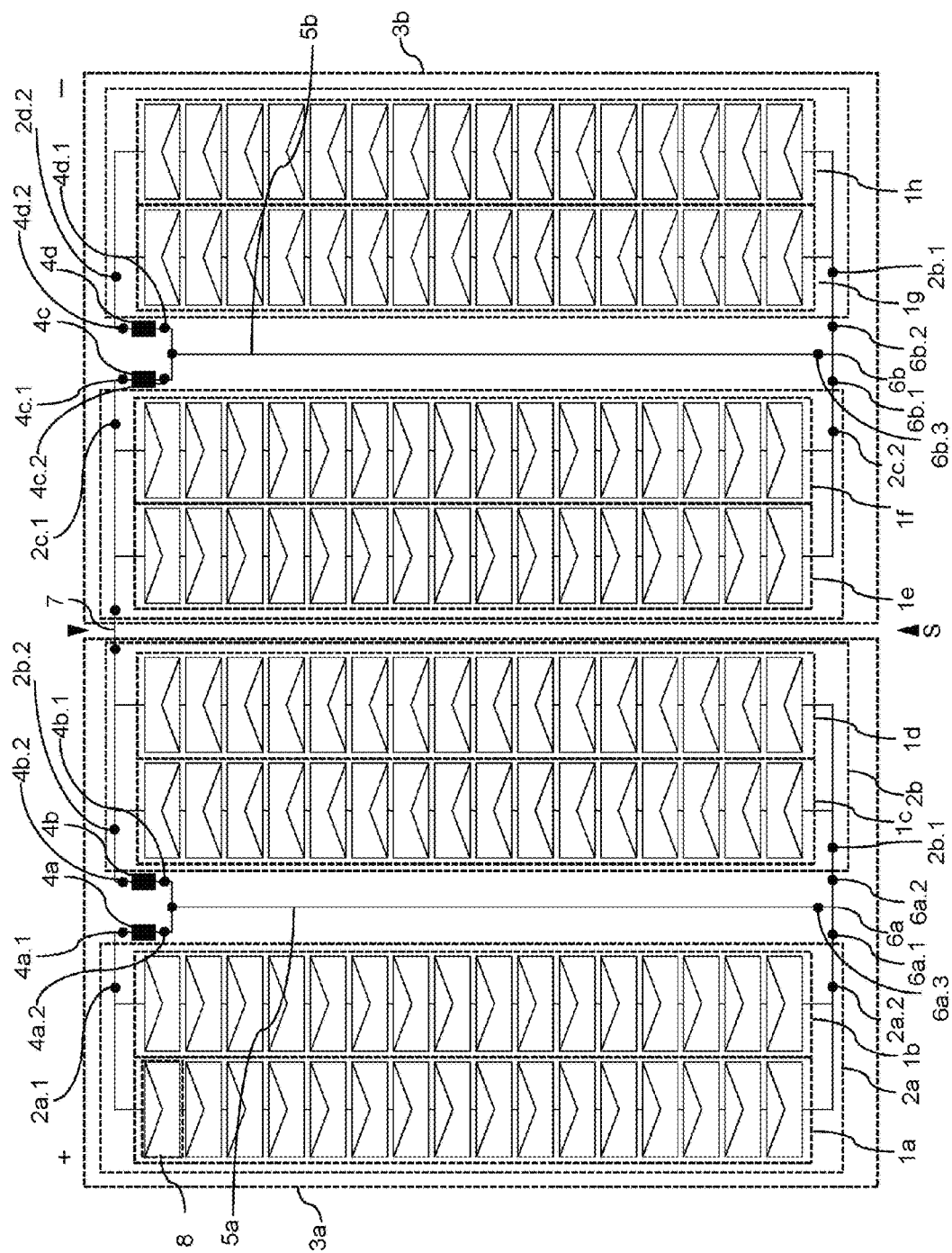
FIGS. 1 to 11 and FIG. 15 each show an exemplary embodiment of a solar cell module according to the invention.

The figures show schematic representations or arrangements which are not to scale. Identical reference signs in the figures designate identical or identically acting elements.

FIGS. 1, 3 to 11, and 16 each show an exemplary embodiment of a solar cell module according to the invention, which has a mirror plane S. This mirror plane S extends through the arrow symbols shown in the figures and is perpendicular to the plane of the drawing. In FIGS. 1 and 3 to 11, the spatial arrangements of the solar cells and the spatial arrangements of the bypass diodes are mirror symmetrical to the mirror plane S, but the electrical orientation of the solar cells is not (arrangement of the positive and negative terminals of the solar cell via which the solar cell is connected in series to the adjacent solar cell). The electrical orientation is identified by an arrow symbol in each solar cell. With respect to the electrical orientation of the solar cells, in these exemplary embodiments a translation perpendicular to the mirror plane S of the left half of the solar cell module with respect to the right half is present. In contrast, the exemplary embodiment shown in FIG. 16 also has a mirror symmetry to the mirror plane S with respect to the electrical orientation of the solar cells.

The exemplary embodiment of a solar cell module according to the invention shown in FIG. 1 comprises two module segments 3a and 3b. The subsegments 2a and 2b are assigned to the module segments 3a and the subsegments 2c and 2d are assigned to the module segment 3b by dashed lines in each case.

The solar cell strings 1a and 1b are assigned to the subsegment 2a, and a plurality of solar cells 8 are assigned to each of these strings. The solar cell strings 1c and 1d are assigned to the subsegment 2b, and a plurality of solar cells 8 are assigned to each of these strings. The solar cell strings 1e and 1f are assigned to the subsegment 2c, and a plurality of solar cells 8 are assigned to each of these strings. The solar cell strings 1g and 1h are assigned to the subsegment 2d, and a plurality of solar cells 8 are assigned to each of these strings. By way of example, the solar cells 8 of the solar cell strings 1a to 1h are each in a number of 16. The solar cells are schematically shown by a triangle arranged in a rectangle. This schematic representation represents the equivalent circuit diagram of a solar cell. The underlying equivalent circuit diagram is based on the general procedure description within a solar cell via the two diode module. In this case, the orientation of the triangle within the rectangle refers to the diode arrangement of the two diodes within the equivalent circuit diagram. The technical current flow direction within the solar cell therefore corresponds to a direction directed against the triangle orientation.

The solar cells of the solar cell strings 1a to 1h are connected in series. The solar cell strings 1a and 1b are arranged interconnected in parallel in the subsegment 2a. The solar cell strings 1c and 1d are arranged interconnected in parallel in the subsegment 2b. The solar cell strings 1e and 1f are arranged interconnected in parallel in the subsegment 2c. The solar cell strings 1g and 1h are arranged interconnected in parallel in the subsegment 2d.

A subsegment connector 6a is arranged between subsegment 2a and subsegment 2b. This subsegment connector 6a establishes an electrically conductive connection between the pole 2a.2 of the subsegment 2a and the pole 2b.1 of the subsegment 2b. A subsegment connector 6b is arranged between subsegment 2c and subsegment 2d. This subsegment connector 6d establishes an electrically conductive connection between the pole 2c.2 of the subsegment 2c and the pole 2d.1 of the subsegment 2d.

The pole 4a.1 of the bypass element 4a is electrically conductively connected to the pole 2a.1 of the subsegment 2a. The pole 4b.2 of the bypass element 4b is electrically conductively connected to the pole 2b.2 of the subsegment 2b. The poles 4a.2 and 4b.1 are electrically conductively connected via the bypass connector 5a to the contact 6a.3 of the subsegment connector 6a.

The pole 4c.1 of the bypass element 4c is electrically conductively connected to the pole 2c.1 of the subsegment 2c. The pole 4d.2 of the bypass element 4d is electrically conductively connected to the pole 2d.2 of the subsegment 2d. The poles 4c.2 and 4d.1 are electrically conductively connected via the bypass connector 5b to the contact 6b.3 of the subsegment connector 6b.

The bypass elements 4a, 4b, 4c, and 4d are each designed as a bypass diode. It is also within the scope of the invention to design the bypass elements in an alternative embodiment as described above, for example, each as a MOSFET.

The module segment 3a is electrically conductively connected to the module segment 3b via a segment connector 7. The segment connector 7 interconnects the pole 2b.2 of the subsegment 2b of the module segment 3a with the pole 2c.1 of the subsegment 2c of the module segment 3b in this case.

In addition to the circuitry arrangement, the exemplary embodiment has a layout described as follows in a top view. The module segments 3a and 3b are adjacent to one another, wherein the module segment 3b is to the right of the module segment 3a. The subsegments 2a to 2d of the module segments 3a and 3b are arranged in parallel to one another, so that the solar cells 8 of the solar cell strings 1a to 1h arranged in series are also arranged in parallel to one another, wherein the individual solar cells 8 of the solar cell strings 1a to 1h form a solar cell grid which can be divided into rows and columns. A solar module grid is superordinate to the solar cell grid. The arrangement described in this example of the figure may be described via this grid.

The solar cell module comprises two solar cell columns arranged on the left, with which the subsegment 2a in the form of solar cell strings 1a and 1b are associated. This is followed by a further column which contains the bypass connector 5a. The following columns are again two solar cell columns with which the subsegment 2b in the form of solar cell strings 1c and 1d are associated. The following columns are again two solar cell columns with which the subsegment 2c in the form of solar cell strings 1e and 1f are associated. This is followed by a further column which contains the bypass connector 5b. The following columns are again two solar cell columns with which the subsegment 2d in the form of solar cell strings 1g and 1h are associated.

The subsegment connector 6a extends within the last row of the solar module grid over the first five columns, which comprises the two solar cell columns of the subsegment 2a, the column of the bypass connector 5a, and the two solar cell columns of the subsegment 2b.

The subsegment connector 6b extends within the last row of the solar module grid over the second five columns, which comprises the two solar cell columns of the subsegment 2c, that of the bypass connector 5b, and the two solar cell columns of the subsegment 2d.

The segment connector 7 extends within the first row of the solar module grid over the middle four columns, which comprises the two solar cell columns of the subsegment 2b and the two solar cell columns of the subsegment 2c.

The second module segment 3b represents a translational displacement of the first module segment 3a with respect to the spatial arrangement of the solar cells 8 and the bypass elements 4. The displacement is perpendicular to the extension direction of the solar cell strings 1a and 1b of the first module segment 3a.

At the upper edge in FIG. 1, the position is identified schematically by symbols "+" and "−" at which the positive and negative contact for interconnecting the solar cell module with an external circuit, in particular with further solar cell modules, are arranged on the rear side on the solar cell module. It is within the scope of the invention in the exemplary embodiments shown in FIG. 1 and also in the other figures that in a reversed solar cell direction arrangement, the respective polarization of the contacts of the solar module is exchanged.

Figure 2:
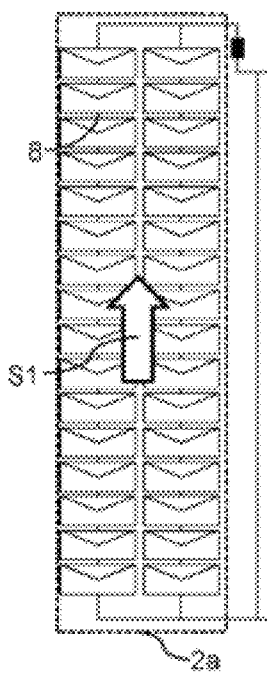
Figure 2:
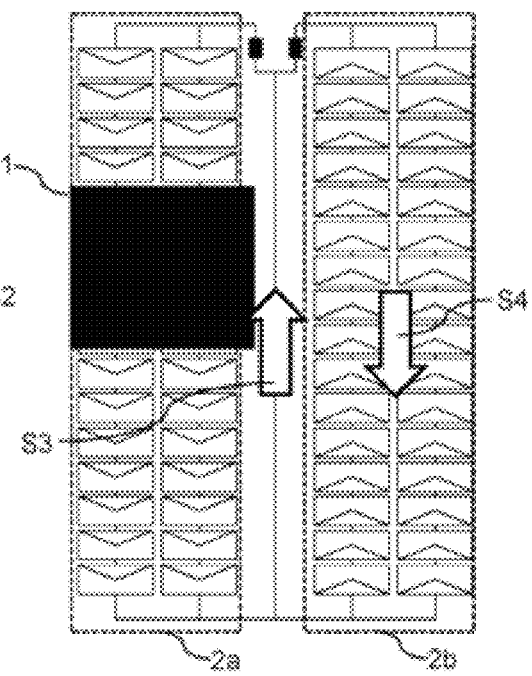
Figure 2:
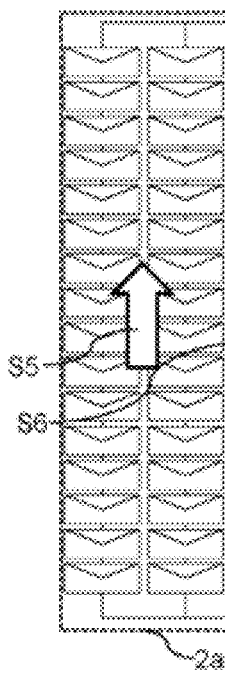
Figure 2:
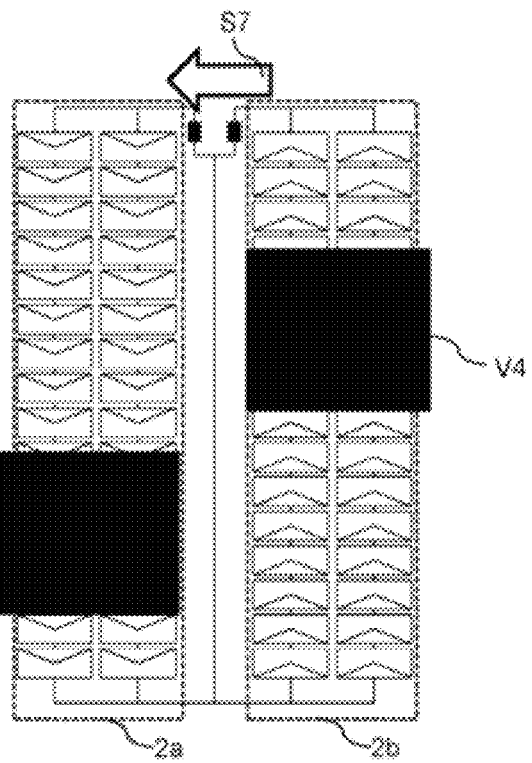

The maps map 1 to map 4 shown in FIG. 2 show a module segment under different shading conditions and thus show the advantages of the embodiment shown in FIG. 1. The shadings of the shading scenarios are schematically represented as a dark rectangle over V1 to V4. The respective current flow directions are indicated via the green arrows S1 to S7.

The scenario 1 which is shown in map 1 is not subject to any shading. A current flow is thus provided from the terminal pole of the module segment identified by "−" via the subsegment 2b via the subsegment connector via the subsegment 2a to the terminal pole identified by "+". This represents the normal case of the module. The bypass elements 4 are inactive.

The scenario 2 which is shown in map 2 is subject to a shading V1. This shading affects solar cells of the subsegment 2a. The solar cells shaded in this scenario are operated with a large negative voltage; this is the case when the current at the operating point of the cell string is above the short-circuit current of the shaded solar cell 8. In this case, a current S3 flows via the bypass connector through the bypass element 4a, the negative voltage at the subsegment 2a is limited by the bypass element 4a and therefore the maximum power loss at the shaded solar cell 8 is also.

The scenario 3 which is shown in map 3 is subject to a shading V2. This shading affects solar cells of the subsegment 2b. The solar cells shaded in this scenario are operated with a large negative voltage; this is the case when the current at the operating point of the cell string is above the short-circuit current of the shaded solar cell 8. In this case, a current S6 flows via the bypass connector through the bypass element 4b, the negative voltage at the subsegment 2b is limited by the bypass element 4b and therefore the maximum power loss at the shaded solar cell 8 is also.

The scenario 4 which is shown in map 4 is subject to two shadings V3 and V4. These shadings affect solar cells 8 of the subsegment 2a and solar cells 8 of the subsegment 2b. The solar cells shaded in this scenario are operated with a large negative voltage; this is the case when the current at the operating point of the respective cell string is above the short-circuit current of the shaded cell. In this case, a current S7 flows through the bypass element 4a and the bypass element 4b, the negative voltages at the subsegment 2a at the subsegment 2b are limited by the bypass elements 4a and 4b and therefore the voltage at the shaded solar cells 8 of the subsegments 4a and 4b is also. Due to this advantageous configuration, a residual output power of the solar cell module always remains even upon shading of a complete solar cell. Furthermore, the advantage results that the bypass elements 4a and 4b and the bypass elements 4c and 4d can each be arranged in a junction box.

Figure 3:
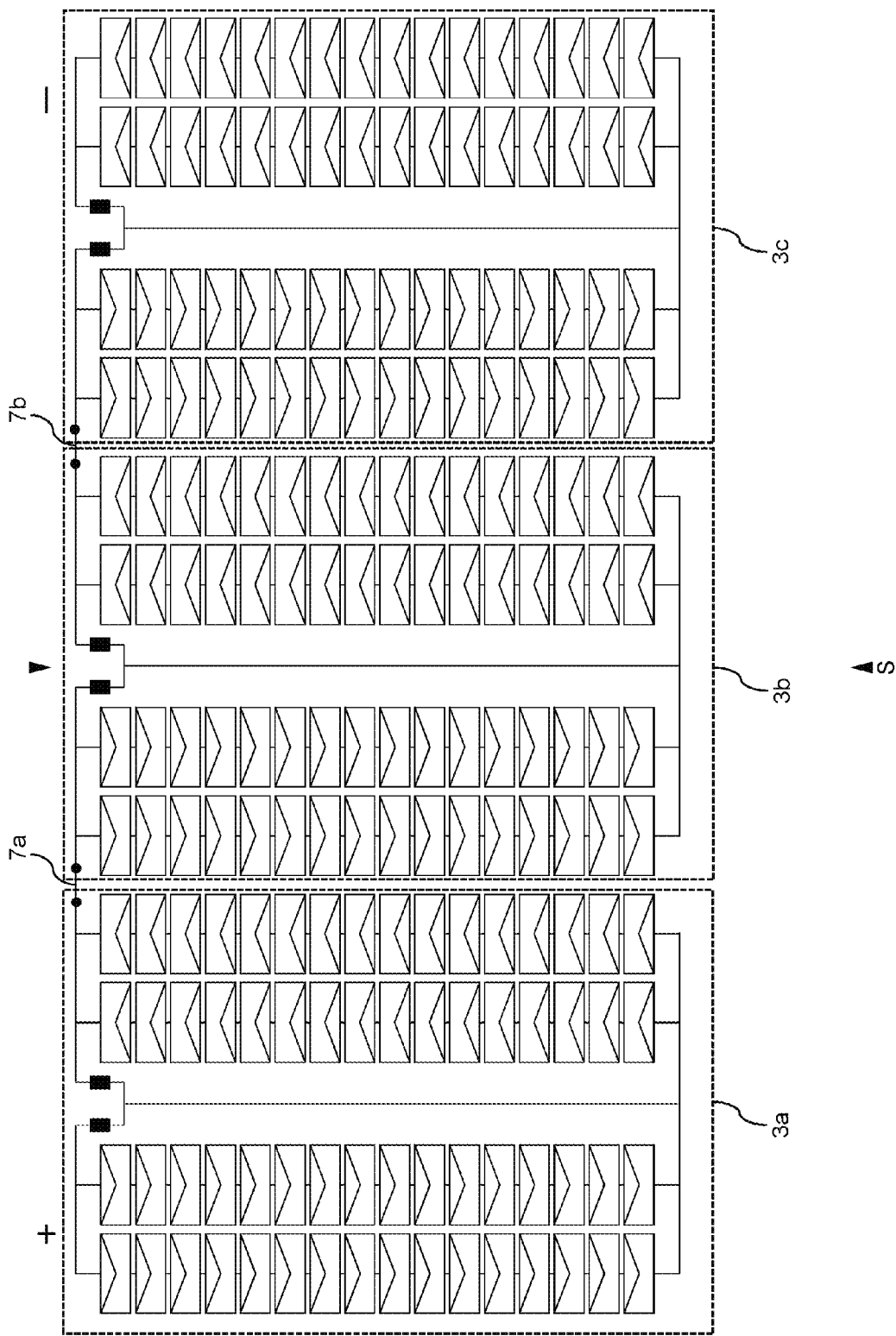

FIGS. 3 to 13 each show modified exemplary embodiments. To avoid repetitions, only the significant differences from the exemplary embodiment shown in FIG. 1 are discussed hereinafter:

In the exemplary embodiment shown in FIG. 3, the module segments 3a and 3b comprise a further module segment 3c. This further module segment 3c is electrically conductively connected via the segment connector 7b to the module segment 3b. The module segment 3c is arranged on the right adjacent to the module segment 3b. The advantage results in this way that an expansion of the configuration shown in exemplary embodiment 1 is to be implemented in a structurally simple manner via a module segment addition.

The module segments 3b and 3c represent a translational displacement of the first module segment 3a with respect to the spatial arrangement of the solar cells 8 and the bypass elements 4. The displacement is perpendicular to the extension direction of the solar cell strings 1a and 1b of the first module segment 3a.

Figure 4:
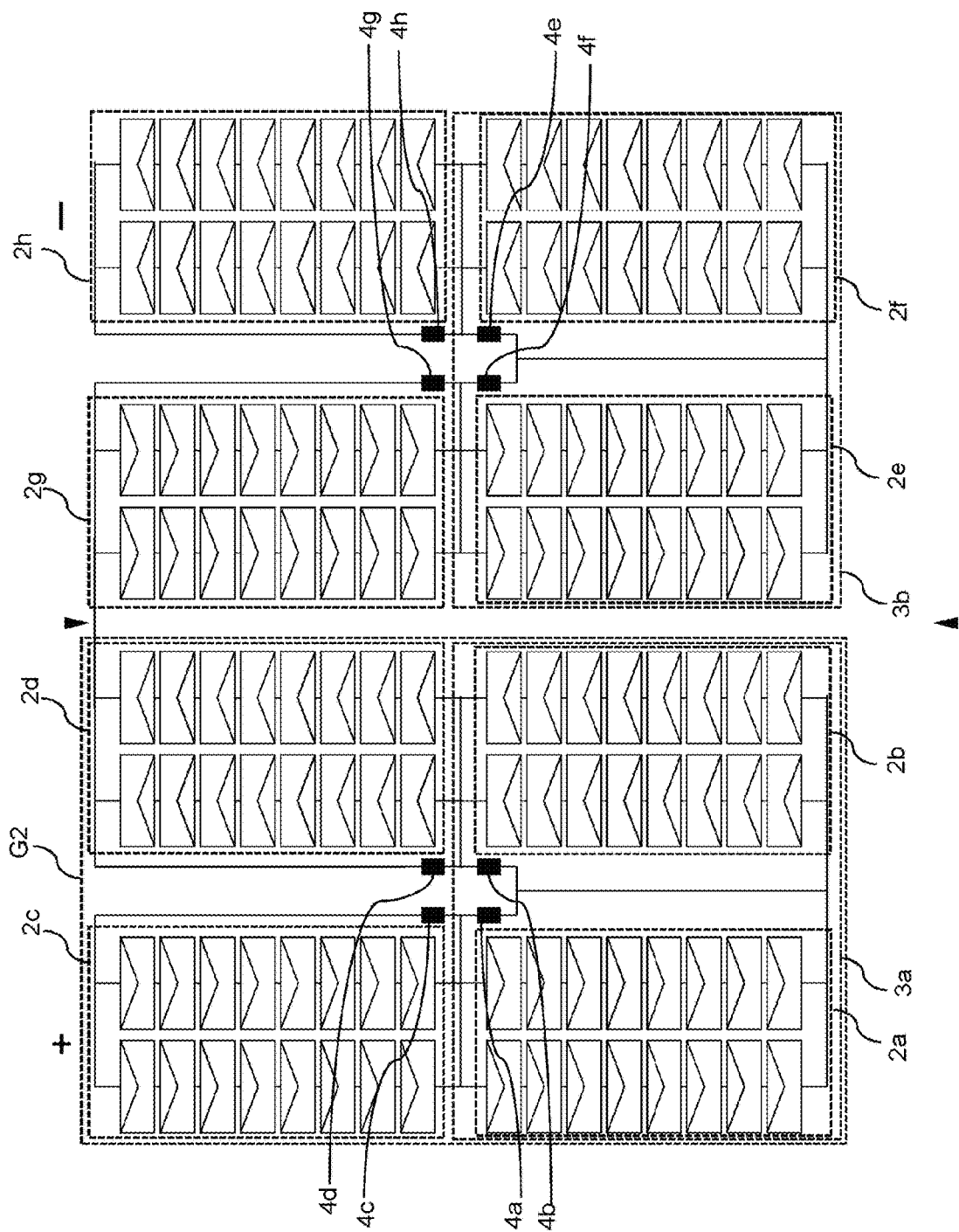

In the exemplary embodiment shown in FIG. 4 (module group arrangement G2), the module segment 3a comprises two additional subsegments 2c and 2d and two additional bypass elements 4c and 4d. The module segment 3b also comprises two additional subsegments 2g and 2h and two additional bypass elements 4g and 4h. The bypass element 4c is connected in parallel to subsegment 2c. The bypass element 4d is connected in parallel to subsegment 2d. The bypass element 4g is connected in parallel to subsegment 2g. The bypass element 4h is connected in parallel to subsegment 2h. The subsegment 2c together with the bypass element 4c is connected in series to the subsegment 2a of the module segment 3a. The subsegment 2d together with the bypass element 4d is connected in series to the subsegment 2b of the module segment 3a. The subsegment 2g together with the bypass element 4g is connected in series to the subsegment 2d. The subsegment 2g together with the bypass element 4g is connected in series to the subsegment 2e of the module segment 3b. The subsegment 2h together with the bypass element 4h is connected in series to the subsegment 2f of the module segment 3b. In this exemplary embodiment, the bypass elements 4a, 4b, 4c, and 4d are arranged in the middle between the subsegments 2a, 2b, 2c, and 2d and the bypass elements 4e, 4f, 4g, and 4h are arranged in the middle between the subsegments 2e, 2f, 2g, and 2h.

The module segment 3b represents a translational displacement of the first module segment 3a with respect to the spatial arrangement of the solar cells 8 and the bypass elements 4. The displacement is perpendicular to the extension direction of the solar cell strings 1a and 1b of the first module segment 3a. The subsegments 2c and 2g represent a translational displacement of the subsegment 2a with respect to the spatial arrangement of the solar cells 8. The subsegments 2d and 2h represent a translational displacement of the subsegment 2b with respect to the spatial arrangement of the solar cells 8.

The advantage results in this way that the number of solar cells 8 of a solar cell string 1 of a subsegment 2 which is protected in case of shading via a bypass element 4 is less than in exemplary embodiment 1. Shading losses caused by lesser solar cell string lengths are thus reduced. Furthermore, the reliability is increased, since in case of shading the power loss in the shaded cells, which is dependent on the number of the cells of a solar cell string, is reduced.

Figure 5:
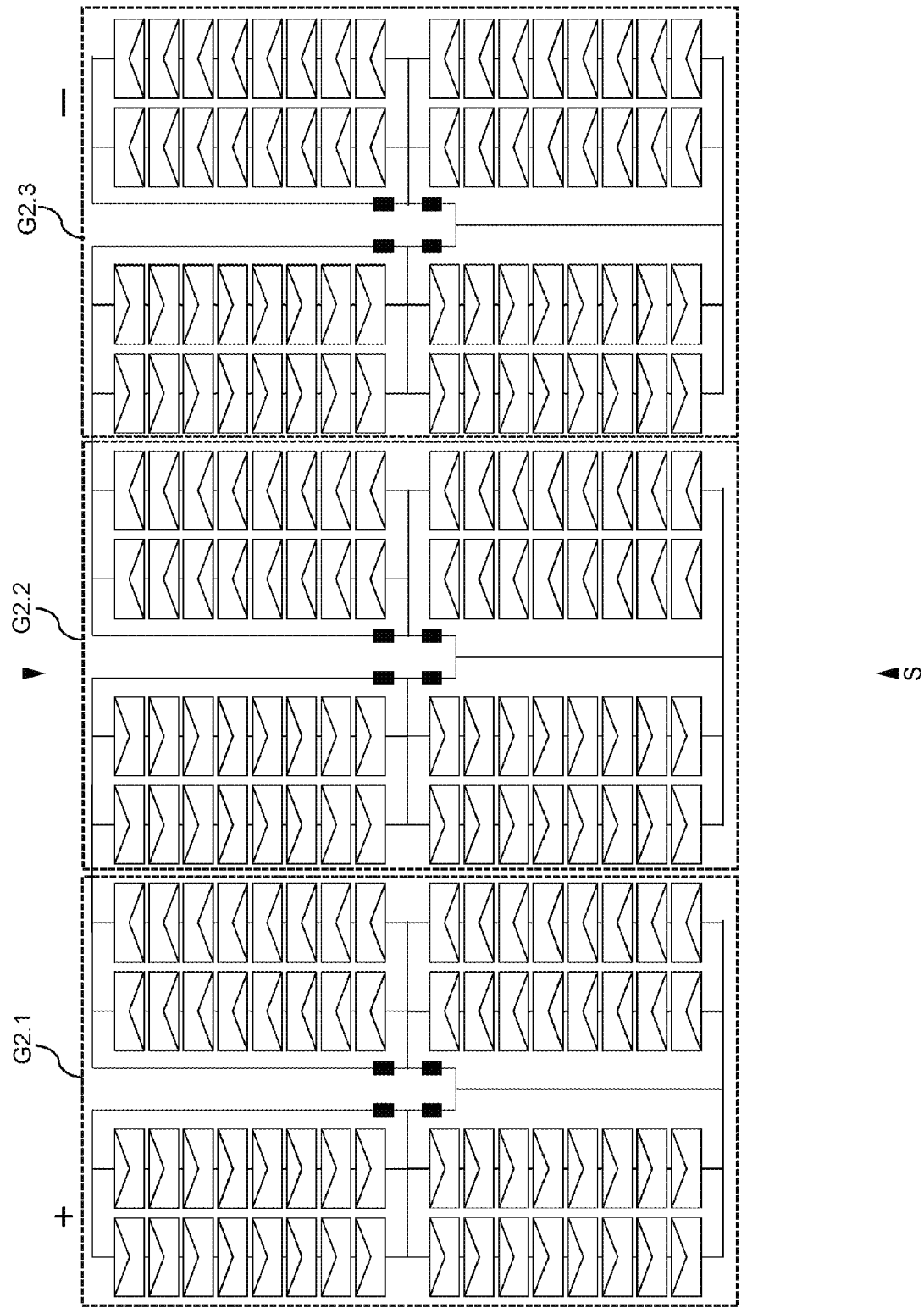

The exemplary embodiment which is shown in FIG. 5 shows an arrangement of three module group arrangements G2.1, G2.2, and G2.3, which each correspond to the module group arrangement G2 from FIG. 4. The module group arrangement G2.3 is arranged on the right adjacent to two module group arrangements G2.1 and G2.2, which represent exemplary embodiment 4. The advantage results in this way that an expansion of the configuration shown in exemplary embodiment 4 is to be implemented in a structurally simple manner via a module segment addition.

The module group arrangements G2.2 and G2.3 represent a translational displacement of the first module group arrangements G2.1 with respect to the spatial arrangement of the solar cells 8 and the bypass elements 4. The displacement is perpendicular to the extension direction of the solar cell strings 1a and 1b of the first module group arrangements.

Figure 6:
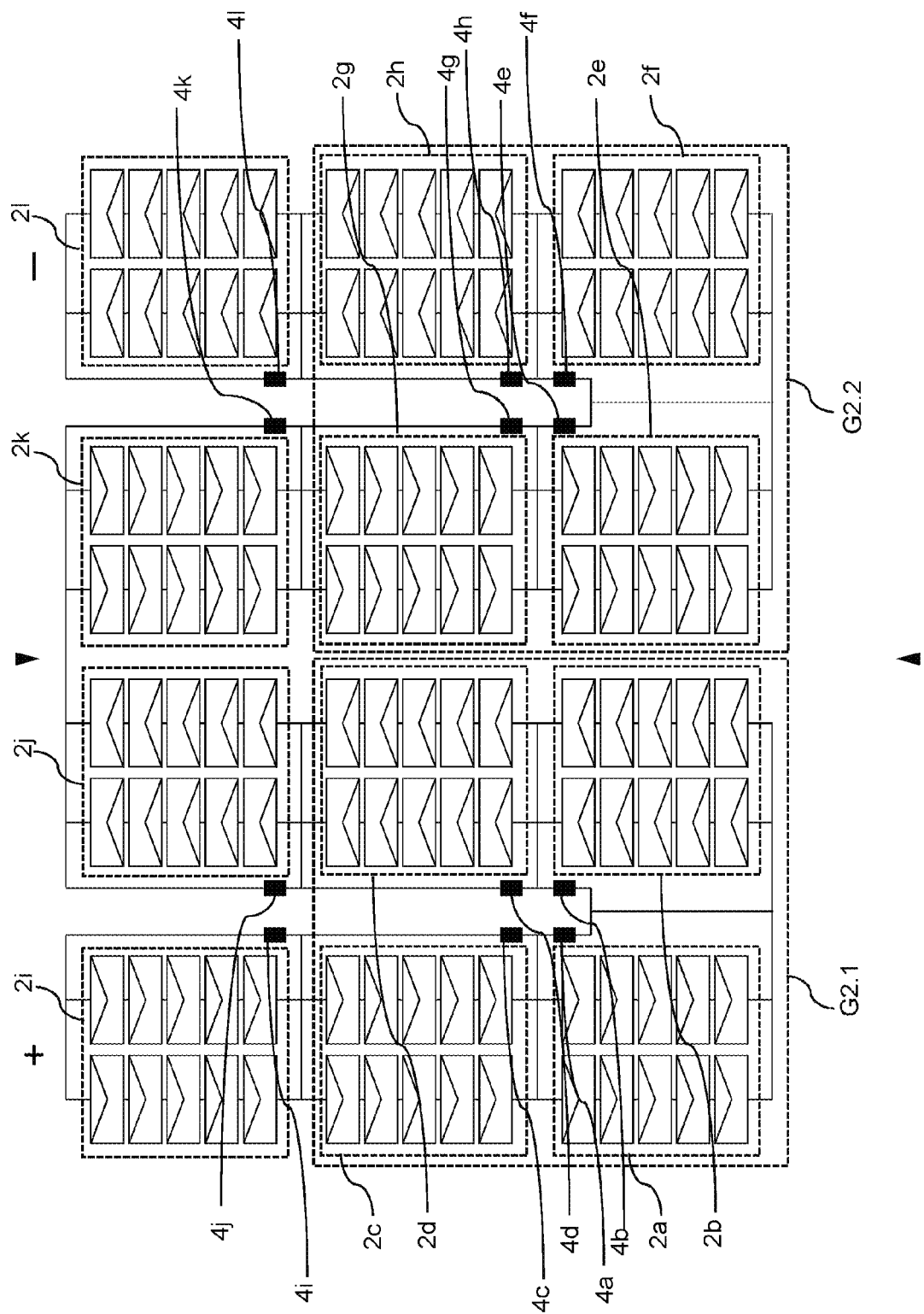

The exemplary embodiment which is shown in FIG. 6 shows an arrangement of two module group arrangements G2.1, G2.2, which each correspond to the module group arrangement G2 from FIG. 4. The module group arrangement G2.1 comprises two additional subsegments 2*i* and 2*j* and two additional bypass elements 4*i* and 4*j*. The module group arrangement G2.2 comprises two additional subsegments 2*k* and 2*l* and two additional bypass elements 4*k* and 4*l*. The bypass element 4*i* is connected in parallel to subsegment 2*i*. The bypass element 4*j* is connected in parallel to subsegment 2*j*. The bypass element 4*k* is connected in parallel to subsegment 2*k*. The bypass element 4*l* is connected in parallel to subsegment 2*l*.

The subsegment 2*i* together with the bypass element 4*i* is connected in series to the subsegment 2*c* of the module group arrangements G2.1. The subsegment 2*j* together with the bypass element 4*j* is connected in series to the subsegment 2*d* of the module group arrangements G2.1. The subsegment 2*k* together with the bypass element 4*k* is connected in series to the subsegment 2*j*. The subsegment 2*k* together with the bypass element 4*k* is connected in series to the subsegment 2*g* of the module group arrangements G2.2. The subsegment 2*l* together with the bypass element 4*l* is connected in series to the subsegment 2*h* of the module group arrangements G2.2.

The module group arrangements G2.2 represent a translational displacement of the module group arrangements G2.1 with respect to the spatial arrangement of the solar cells 8 and the bypass elements 4. The displacement is perpendicular to the extension direction of the solar cell strings 1*a* and 1*b* of the first subsegment 2*a*. The subsegments 2*i* and 2*k* represent a translational displacement of the subsegments 2*a* with respect to the spatial arrangement of the solar cells 8. The subsegments 2*j* and 2*l* represent a translational displacement of the subsegment 2*b* with respect to the spatial arrangement of the solar cells 8.

The advantage results in this way that the number of solar cells 8 of a solar cell string 1 of a subsegment 2 which is protected in case of shading via a bypass element 4 is less than in the exemplary embodiment 5. Shading losses caused by lesser solar cell string lengths are thus reduced. Furthermore, the reliability is increased, since in case of shading the power loss in the shaded cells, which depends on the number of the cells of a solar cell string, is reduced.

Figure 7:
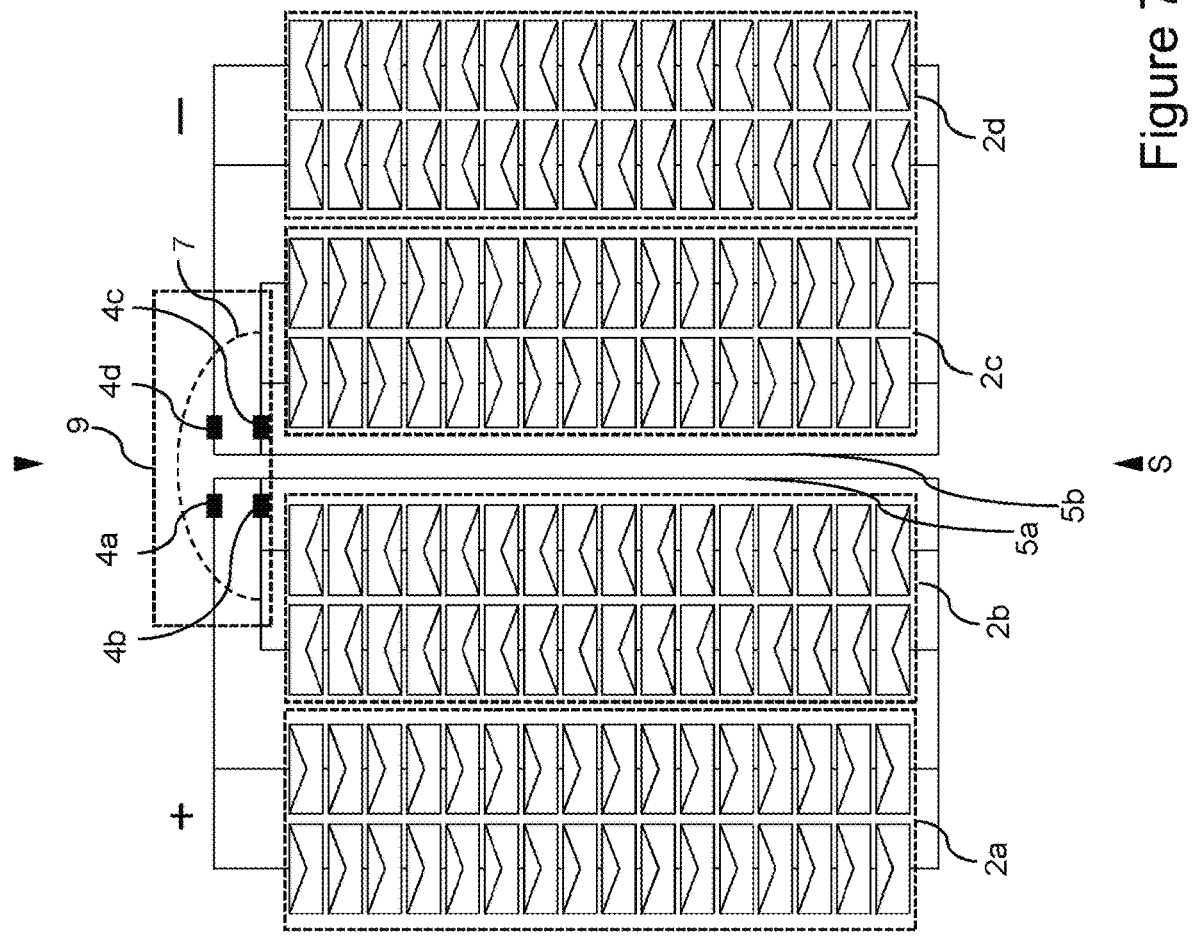

The exemplary embodiment which is shown in FIG. 7 shows a similar arrangement as shown in FIG. 1. However, in this embodiment the segment connector 7 and the bypass elements 4*a*, 4*b*, 4*c*, and 4*d* are housed inside a junction box 9. If one observes the arrangement by means of the solar module grid, the bypass connectors 5*a* and 5*b* and the bypass elements 4*a*, 4*b*, 4*c*, and 4*d* are in the middle column with two solar cell columns (made up of subsegment 2*c* and subsegment 2*d*) on the right and two solar cell columns (made up of subsegment 2*a* and subsegment 2*b*) on the left. The advantage results in this way that the segment connector can be housed inside the junction box and is therefore flexibly positionable. Moreover, this has an installation advantage since the interconnection via the junction box is freely accessible. It is therefore possible to couple or decouple a complete module segment easily. Moreover, it is possible to arrange the bypass connectors one over another, in particular perpendicular to a planar extension of the solar cell module. The advantage results in this way that the area utilization is improved, which leads to an increase of the efficiency.

Figure 8:
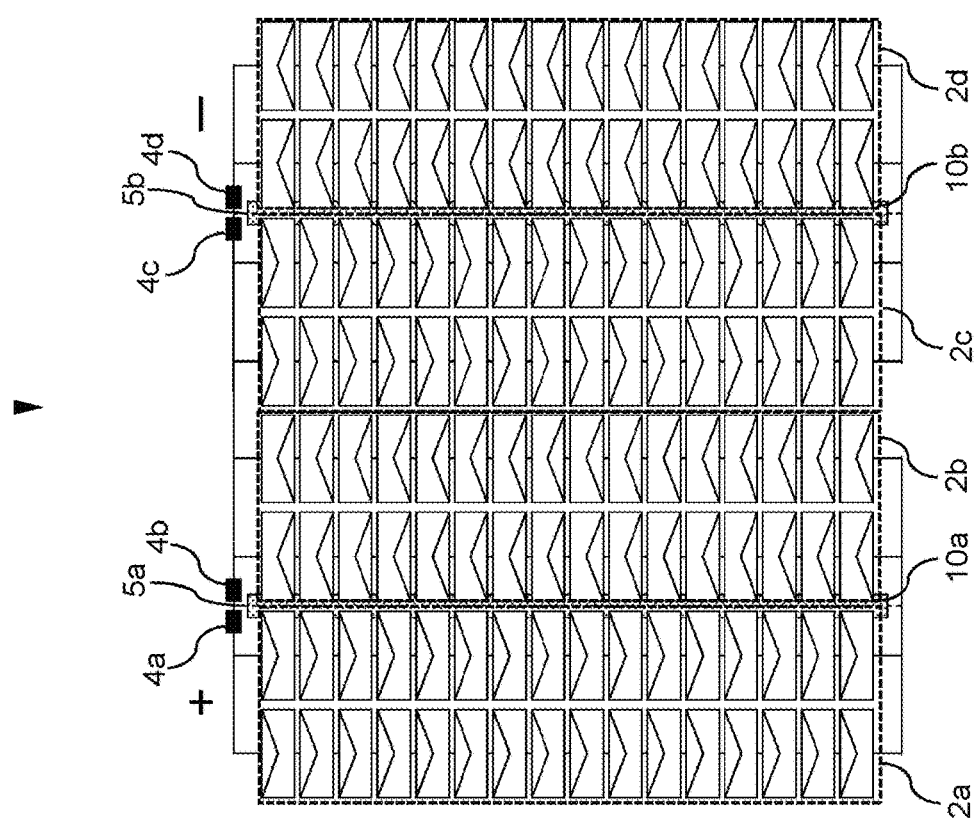

The exemplary embodiment which is shown in FIG. 8 shows a special embodiment of the embodiment from FIG. 1. In this case, the bypass connectors 5*a* and 5*b* are each attached behind the solar cell plane, isolated by an insulation layer 10*a* and 10*b*, between the subsegments 2*a* and 2*b* or the subsegments 2*c* and 2*d* and the bypass elements 4*a*, 4*b*, 4*c*, and 4*d* are attached above the subsegment connectors. Because of this arrangement, the solar cells 8 can be arranged in an advantageously uniform grid. All columns are therefore occupied by solar cells 8.

Figure 9:
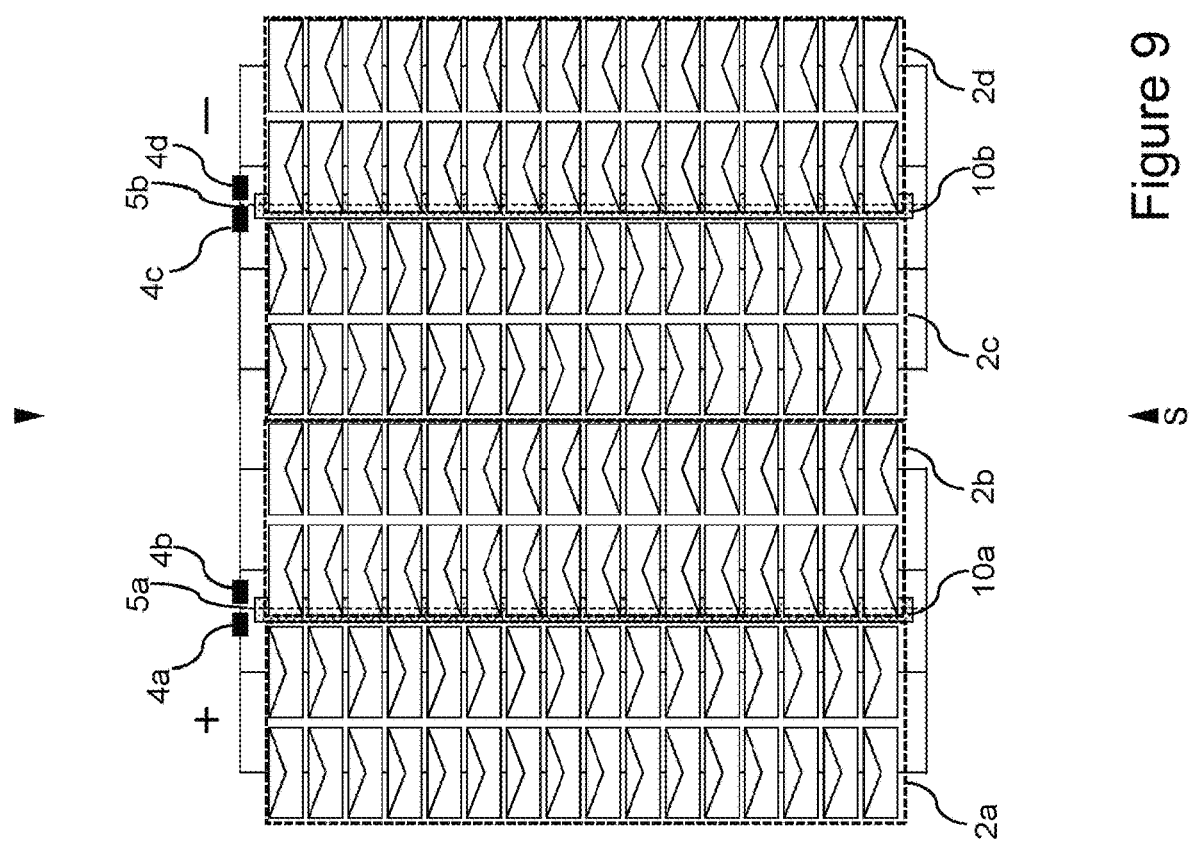

The exemplary embodiment which is shown in FIG. 9 shows a special embodiment of the embodiment from FIG. 1. In this case, the bypass connectors 5*a* and 5*b* are each attached behind the solar cell plane, insulated by an insulation layer 10*a* and 10*b*, and by way of example below subsegment 2*b* or subsegment 2*d* and the bypass elements 4*a*, 4*b*, 4*c*, and 4*d* are attached above the subsegment connectors. Because of this arrangement, the solar cells 8 can be arranged in an advantageously uniform grid. All columns are therefore occupied by solar cells 8.

Figure 10:
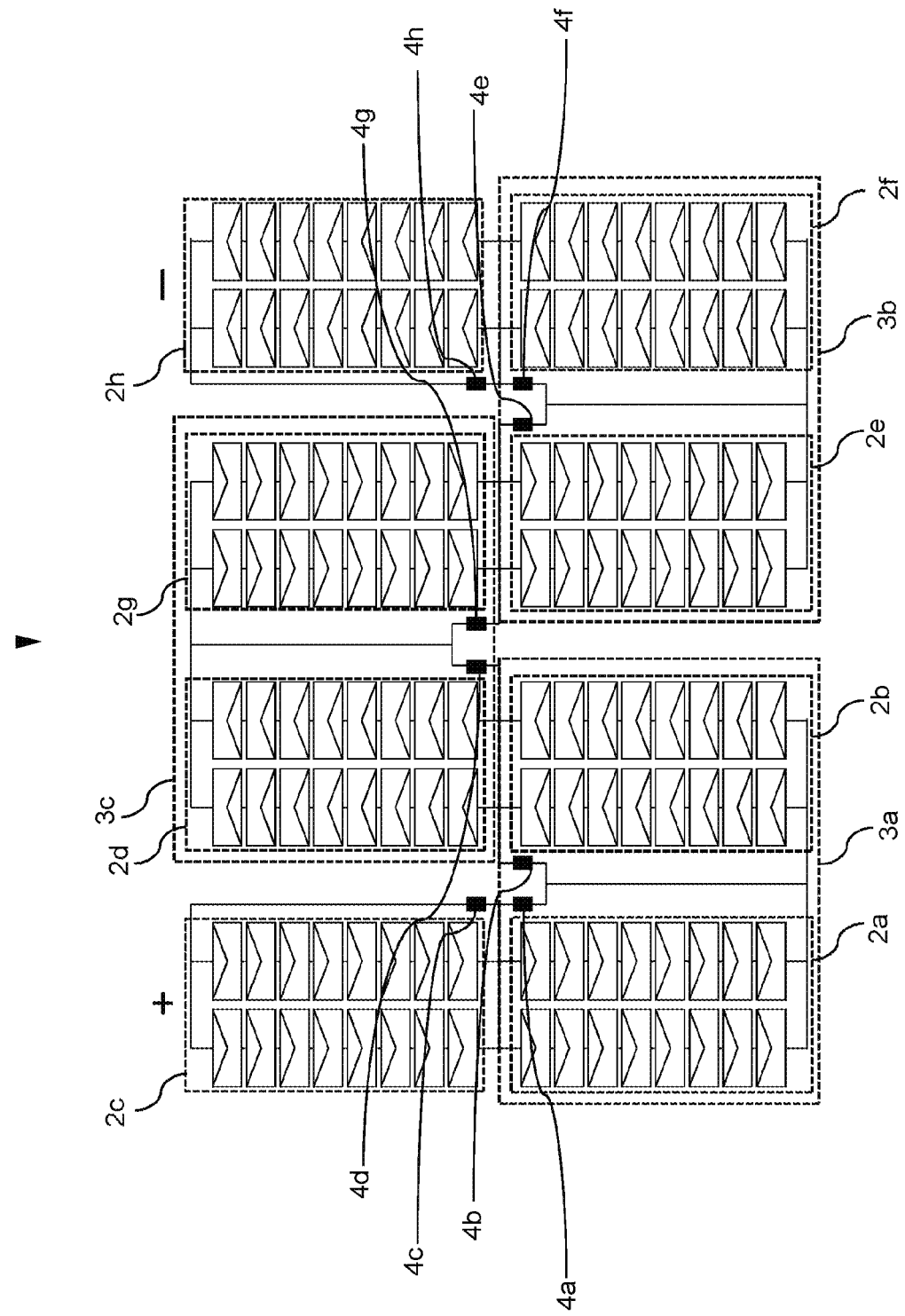

The embodiment shown in FIG. 10 comprises a first module segment 3*a* and a second module segment 3*b*, which are each additionally expanded by a subsegment 2*e* and 2*h* and a third module segment 3*c*. This third module segment 3*c* is arranged between the first module segment 3*a* and the second module segment 3*b*. The first module segment 3*a* and the second module segment 3*b* each comprise a third bypass element 4*c* and 4*h*. The subsegments 2*a* to 2*h* are arranged in parallel to one another in four subsegment pairs (2*c* and 2*a*, 2*d* and 2*b*, 2*g* and 2*e*, 2*h* and 2*f*). The three bypass elements 4*c*, 4*a*, and 4*b* of the first module segment 3*a* are arranged in the middle between the first subsegment pair (2*c* and 2*a*) and second subsegment pair (2*d* and 2*b*) of the module. The first bypass element 4*d* and second bypass element 4*g* of the third module segment 3*c* are arranged in the middle between the first subsegment 2*d* and the second subsegment 2*g* of the third module segment 3*c*. The bypass elements 4*e*, 4*f*, and 4*h* of the second module segment 3*c* are arranged in the middle between the third subsegment pair (2*g* and 2*e*) and fourth subsegment pair (2*h* and 2*f*) of the module. The advantage results in this way that the junction boxes in which the bypass elements 4 are housed (junction box 1: 4*a*, 4*b*, and 4*c*, junction box 2: 4*d*, and 4*g*, junction box 3: 4*e*, 4*f*, and 4*h*), comprise not more than 3 bypass elements. In the active case of the bypass elements 4, heat is emitted because of the current flow through the bypass elements 4. To distribute this heat uniformly onto the solar cell module, an arrangement having a smaller number of bypass elements per junction box which extends at regular intervals over the solar module surface is advantageous. Moreover, it is advantageous in this embodiment that a bypass connector is used less in comparison to exemplary embodiment 4.

The module segment 3*b* represents a translational displacement of the first module segment 3*a* with respect to the spatial arrangement of the solar cells 8 and the bypass elements 4. The displacement is perpendicular to the extension direction of the solar cell strings 1*a* and 1*b* of the first module segment 3*a*. The module segment 3*c* represents a translational displacement of the first module segment 3*a* with respect to the spatial arrangement of the solar cells 8 and the bypass elements 4. The displacement is perpendicular to the extension direction of the solar cell strings 1*a* and 1*b* of the first module segment 3*a*, moreover, the module segment 3*c* is rotated by 180° counter to the module segment 3*a* and the associated bypass elements 4*d* and 4*g*, wherein the arrangement of the solar cells 8 of the subsegment 2*d* represents a translational displacement of the subsegment 2*b* and the arrangement of the solar cells 8 of the subsegment 2g represents a translational displacement of the subsegment 2a. The subsegment 2c represents a translational displacement of the subsegment 2a with respect to the spatial arrangement of the solar cells 8. The subsegment 2h represents a translational displacement of the subsegment 2b with respect to the spatial arrangement of the solar cells 8.

Figure 11:
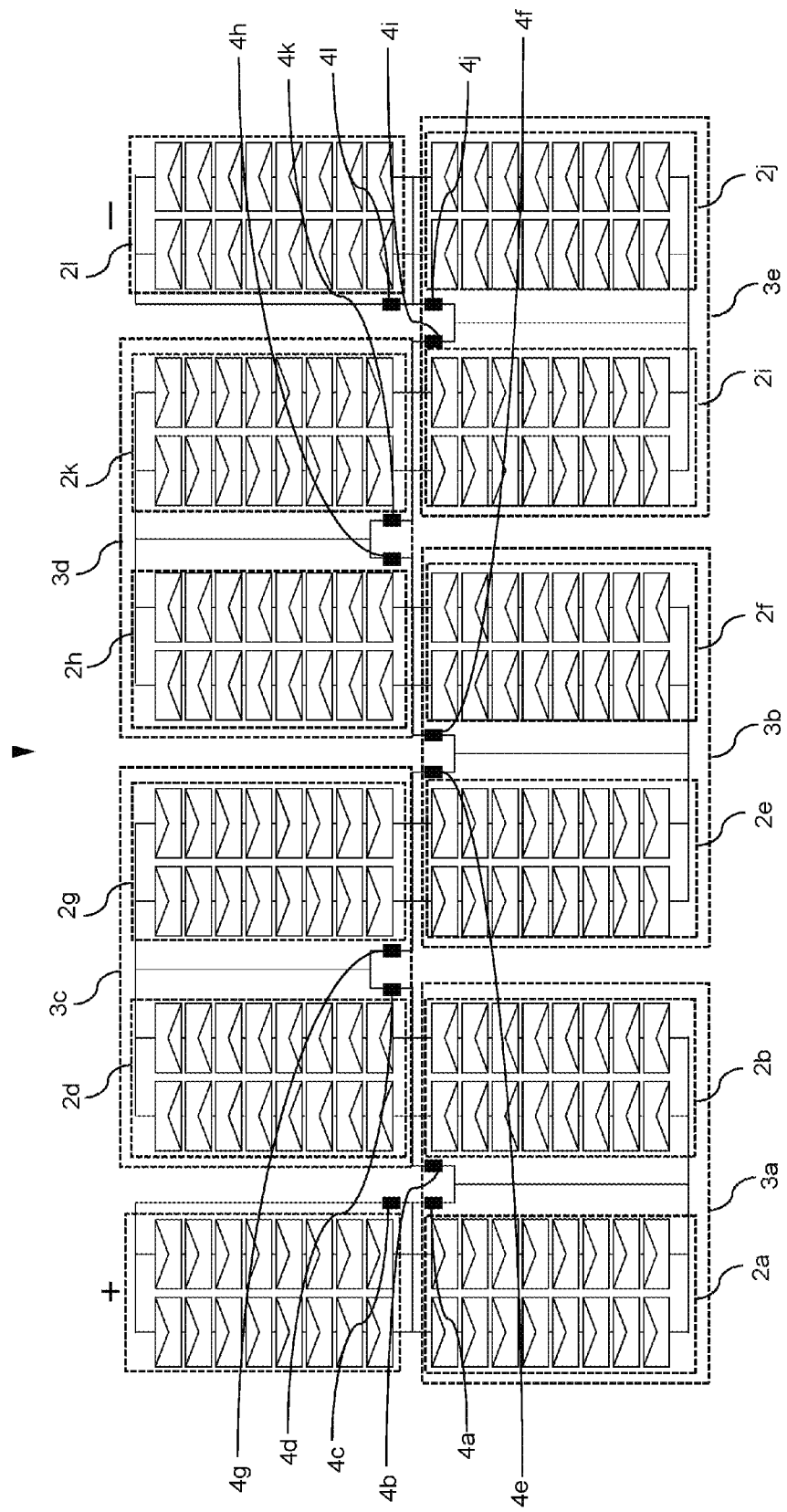

The exemplary embodiment which is shown in FIG. 11 shows a special embodiment of the embodiment from FIG. 10. In this case, the module segment 3b is not expanded by one further subsegment, but by two further module segments 3d and 3e. Herein the module segment 3e and also the module segment 3b is expanded in FIG. 10 by a further subsegment 2l and bypass element 4l. The bypass elements 4a, 4b, and 4c of the first module segment 3a are arranged in the middle between the subsegments 2a, 2b, and 2c. The bypass elements 4d and 4g of the third module segment 3c are arranged in the middle between the subsegments 2d and 2g. The bypass elements 4e and 4f of the second module segment 3b are arranged in the middle between the subsegments 2e and 2f. The bypass elements 4h and 4k of the fourth module segment 3d are arranged in the middle between the subsegments 2h and 2k. The bypass elements 4i, 4j, and 4l of the fifth module segment 3e are arranged in the middle between the subsegments 2i, 2j, and 2l. The advantage results in this way than an expansion of the configuration shown in exemplary embodiment 10 is to be implemented in a structurally simple manner via a module segment addition.

The module segments 3b and 3e represent a translational displacement of the first module segment 3a with respect to the spatial arrangement of the solar cells 8 and the bypass elements 4. The displacement is perpendicular to the extension direction of the solar cell strings 1a and 1b of the first module segment 3a. The module segments 3c and 3d represent a translational displacement of the first module segment 3a with respect to the spatial arrangement of the solar cells 8 and the bypass elements 4. The displacement is perpendicular to the extension direction of the solar cell strings 1a and 1b of the first module segment 3a, moreover, the module segment 3c and 3d and the associated bypass elements 4d and 4g and 4h and 4k are rotated by 180° counter to the module segment 3a, wherein the arrangement of the solar cells 8 of the subsegment 2d and 2h represents a translational displacement of the subsegment 2b and the arrangement of the solar cells 8 of the subsegments 2g and 2k represents a translational displacement of the subsegment 2a. The subsegment 2c represents a translational displacement of the subsegment 2a with respect to the spatial arrangement of the solar cells 8. The subsegment 2l represents a translational displacement of the subsegment 2b with respect to the spatial arrangement of the solar cells 8.

The above-described module arrangements are also suitable for constructing larger solar cell modules having a large number of solar cells.

Figure 12:
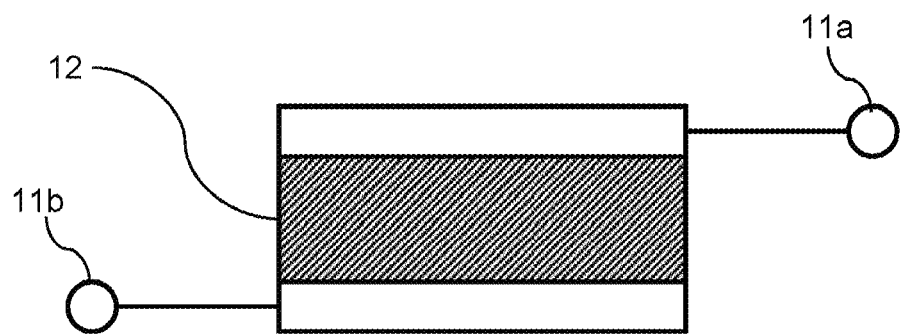
FIGS. 12 to 14 show solar cells which are used in the exemplary embodiments.

FIG. 12 shows a schematic section through the structure of a single-junction solar cell which was used in the preceding exemplary embodiments. The solar cell shown comprises two contacts 11a and 11b in addition to the actual solar cell layer 12.

Figure 13:
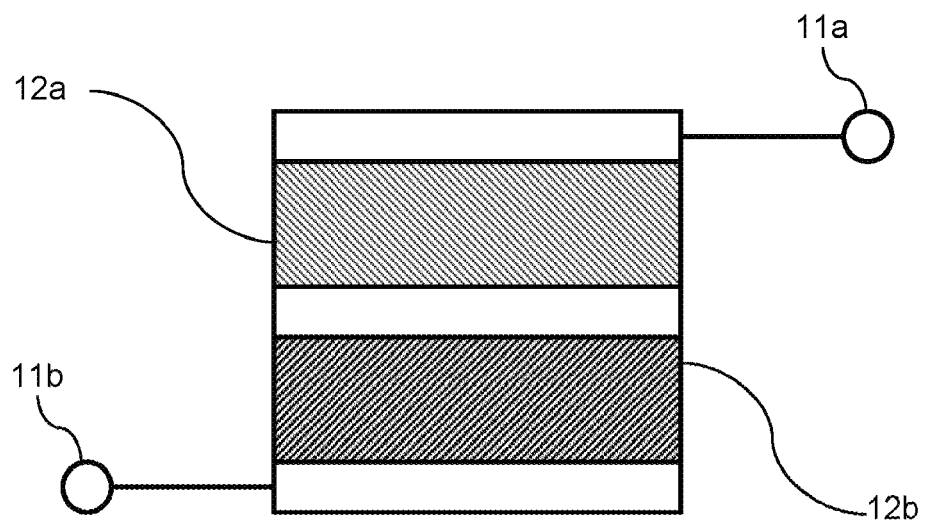

FIG. 13 shows a schematic section through the structure of a dual-junction solar cell which can optionally be used. The solar cell shown comprises two cell layers separated from one another, on the one hand, the top cell layer 12a and the bottom cell layer 12b. In addition to the actual solar cell layers 12a and 12b, the solar cell comprises two contacts 11a and 11b.

Figure 14:
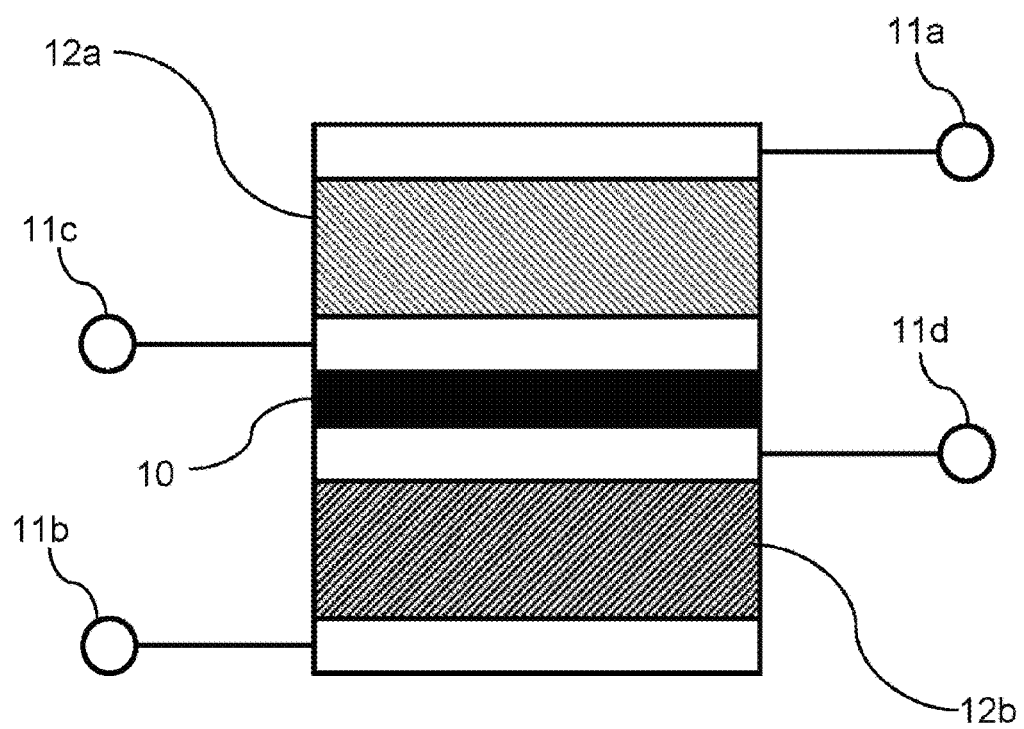

FIG. 14 shows a schematic section through the structure of a 4-terminal dual-junction solar cell which can optionally be used and is especially important in embodiment 15. The solar cell shown has two cell layers insulated from one another, on the one hand, the top cell layer 12a and the bottom cell layer 12b. In addition to the actual solar cell layers 12a and 12b, the solar cell comprises four contacts 11a, 11b, 11c, and 11d.

Figure 15:
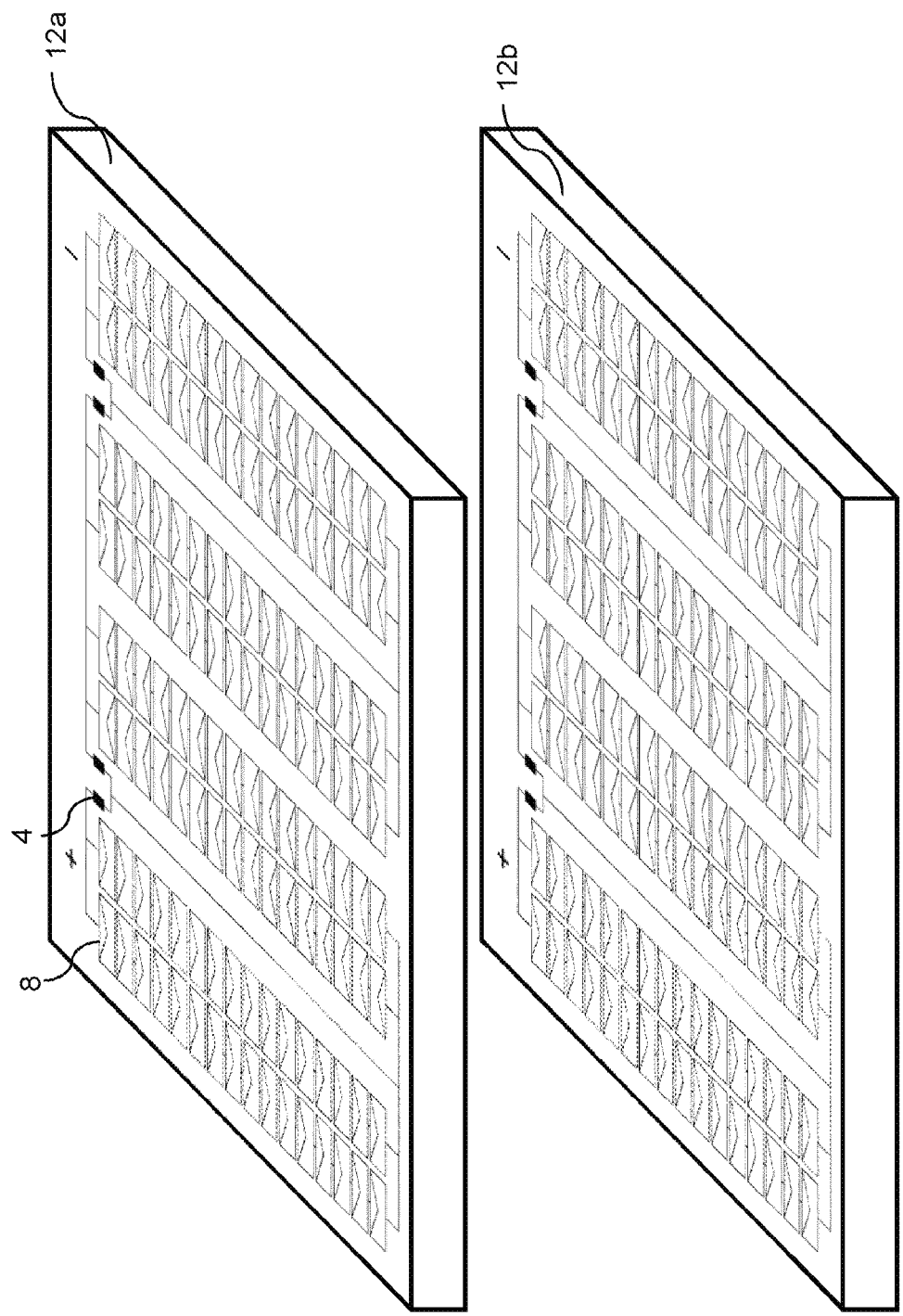

FIG. 15 shows an exemplary embodiment which is used if 4-terminal dual-junction solar cells are used. The solar cells 8 and bypass elements 4 of the top cell level are arranged and interconnected according to exemplary embodiment 1. The solar cells 8 of the bottom cell level 12b are arranged and interconnected according to exemplary embodiment 1, like the top cell level 12a. These two levels and thus the modules are arranged one over the other and form a module stack.

It is within the scope of the invention that the solar cell module comprises further module segments. In particular, it is within the scope of the invention that the described configuration of the module segments is repeated multiple times.

Figure 16:
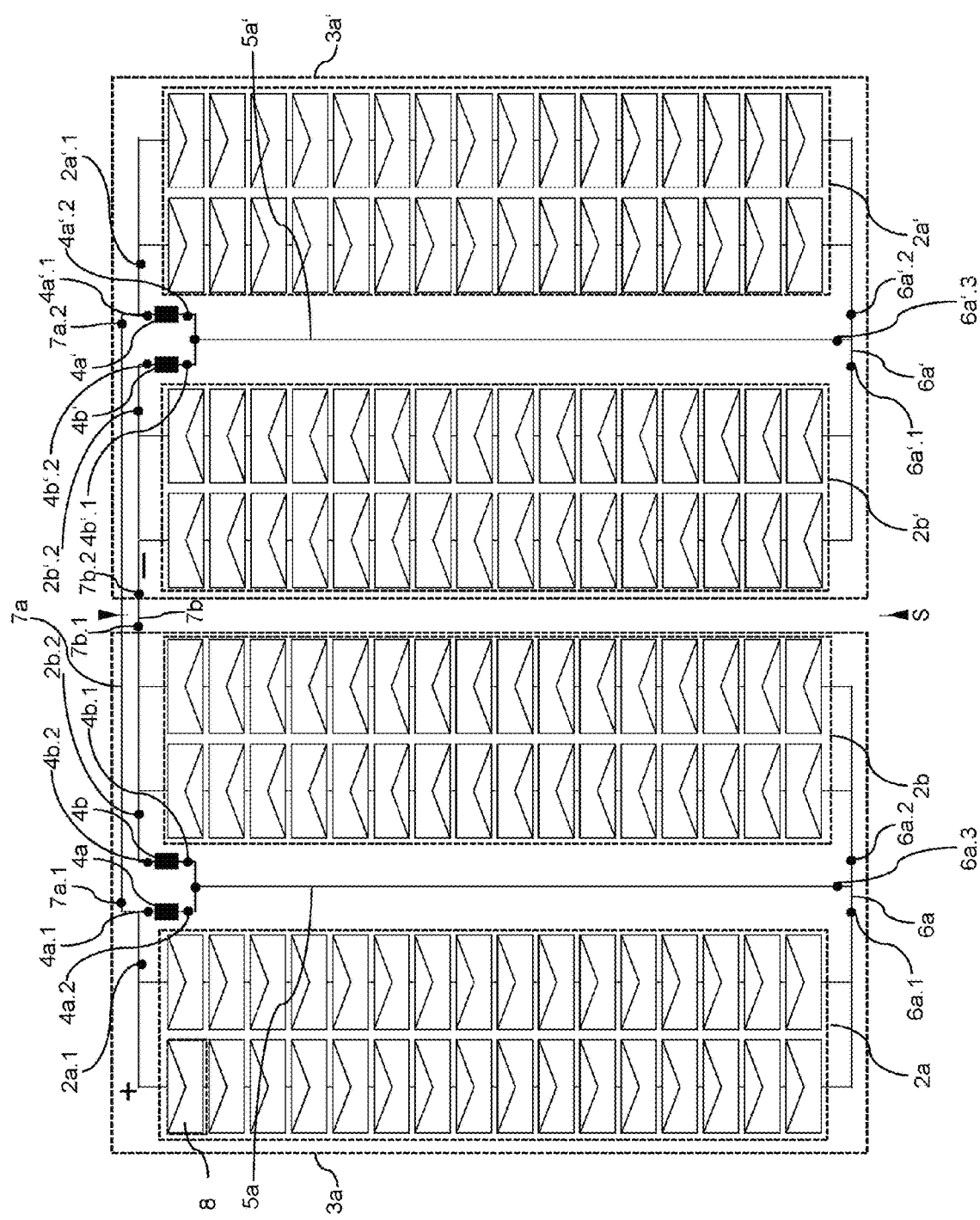
FIG. 16 shows an exemplary embodiment of a solar cell module.

FIG. 16 shows a further exemplary embodiment. This exemplary embodiment differs from the exemplary embodiment from FIG. 1 in that the first module segment 3a is reflected along a mirror plane A and this module segment mirroring 3a' is interconnected in parallel with the module segment 3a by means of a first segment connector 7a and a second segment connector 7b. In this case, the segment connector 7a and the segment connector 7b are designed as bipolar. The first pole of the first segment connector 7a.1 is electrically conductively connected to the first pole of the first bypass element 4a.1 of the first module segment 3a and the first pole of the first subsegment 2a.1 of the first module segment 3a. The second pole of the first segment connector 7a.2 is electrically conductively connected to the first pole of the mirrored first bypass element 4a'.1 of the mirrored first module segment 3a' and the first pole of the mirrored first subsegment 2a'.1 of the first mirrored module segment 3a'. The first pole of the second segment connector 7b.1 is electrically conductively connected to the second pole of the second bypass element 4b.2 of the first module segment 3a and the second pole of the second subsegment 2b.2 of the first module segment 3a. The second pole of the second segment connector 7b.2 is electrically conductively connected to the second pole of the mirrored second bypass element 4b'.2 of the mirrored first module segment 3a' and the second pole of the mirrored second subsegment 2b'.2 of the first mirrored module segment 3a'. Subsegments 2a and 2b are electrically conductively connected in series via the subsegment connector 6a, and the subsegments 2a' and 2b' are electrically conductively connected in series via the subsegment connector 6a', wherein these subsegments (2a and 2b, 2a' and 2b') connected in series are connected in parallel to one another via the segment connectors 7a and 7b.

The advantage results in this way that the total voltage across the solar module is less than in the arrangement according to the first exemplary embodiment in FIG. 1. This is very advantageous if the exemplary embodiment is embodied using tandem solar cells, since these are necessarily to have higher voltages at the operating point due to their structure than conventional single solar cells.

The solar cell module shown in FIG. 16 has a central mirror plane S which is perpendicular to the plane of the drawing and thus perpendicular to the solar cell module (the planar extension of the solar cell module) and extends along the dashed line S. This represents a mirror plane with respect to the spatial arrangement of the solar cells 8, solar cell strings 1, and bypass elements 4 of the solar cell module.

LIST OF REFERENCE NUMERALS 1. solar cell string
2. subsegment
3. module segment
4. bypass element
5. bypass element connector
6. subsegment connector
7. segment connector
8. solar cell
9. junction box
10. insulation layer
11. contact
12. cell layer
13. module segment stack

The invention claimed is:

1. A solar cell module, comprising:
   a first module segment (3a), wherein the first module segment (3a) comprises a first subsegment (2a) and at least one second subsegment (2b),
   the first subsegment and the at least one second subsegment (2a, 2b) each comprise at least one solar cell string (1a, 1b) and each of said solar cell strings (1a, 1b) comprises a plurality of solar cells (8) connected in series,
   wherein the first subsegment and the at least one second subsegment (2a, 2b) of the first module segment (3a) each comprises first and second electrical poles (2a.1, 2a.2), wherein the second pole of the first subsegment (2a.2) and the first pole of the second subsegment (2b.1) are electrically conductively connected by a subsegment connector (6a) of the first module segment (3a) to form a series circuit of the first and second subsegment (2a, 2b),
   the first module segment (3a) comprises a first bypass element (4a) and at least a second bypass element (4b),
   wherein a first pole of the first bypass element (4a.1) of the first module segment (3a) is connected to the first pole of the first subsegment (2a.1) of the first module segment (3a), a second pole of the second bypass element (4b.2) of the first module segment (3a) is electrically conductively connected to the second pole of the second subsegment (2b.2) of the first module segment (3a), and a second pole of the first bypass element (4a.2) of the first module segment (3a) and a first pole of the second bypass element (4b.1) of the first module segment (3a) are electrically conductively connected by a first bypass connector (5a) to the subsegment connector (6a) of the first module segment (3a), such that the first bypass element (4a) is connected in parallel with the first subsegment (2a) by the first bypass connector (5a) and the second bypass element (4b) is connected in parallel with the second subsegment (2b) by the first bypass connector (5a),
   a second module segment (3b) which comprises a first bypass element (4c) of the second module segment (3b) and at least a second bypass element (4d) of the second module segment (3b),
   wherein a first pole of the first bypass element (4c.1) of the second module segment (3b) is connected to a first pole of a first subsegment (2c.1) of the second module segment (3b), a second pole of the second bypass element (4d.2) of the second module segment (3b) is electrically conductively connected to a second pole of a second subsegment (2d.2) of the second module segment (3b), and a second pole of the first bypass element (4c.2) of the second module segment (3b) and a first pole of the second bypass element (4d.1) of the second module segment (3b) are electrically conductively connected by a second bypass connector (5b) to a subsegment connector (6b) of the second module segment (3b), and
   the first and the second module segments (3a, 3b) are indirectly or directly interconnected in series or in parallel.

2. The solar cell module as claimed in claim 1, wherein
   the first bypass connector (5a) is arranged between the first subsegment (2a) of the first module segment (3a) and the second subsegment (2b) of the first module segment (3a), and
   the second bypass connector (5b) is arranged between the first subsegment (2c) of the second module segment (3b) and the second subsegment (2d) of the second module segment (3b).

3. The solar cell module as claimed in claim 1, wherein
   the first and second bypass connectors (5a, 5b) are arranged between the first module segment (3a) and the second module segment (3b).

4. The solar cell module as claimed in claim 1, further comprising at least one segment connector (7) for electrically conductive connection in series or in parallel of the first and the second module segments (3a, 3b), the at least one segment connector (7) is arranged between the first and the second module segments (3a, 3b).

5. The solar cell module as claimed in claim 4, wherein
   the first module segment and the second module segment (3a, 3b), which are connected by the at least one segment connector (7), are arranged adjacent to one another in a longitudinal arrangement which is perpendicular to an orientation of the solar cell strings (1).

6. The solar cell module as claimed in claim 1, wherein
   the solar cell strings (1) of the first and the second module segments (3a, 3b) are arranged such a that the solar cell module has a rectangular shape with a short edge and a long edge, and
   a linear row of the solar cell strings (1) in at least one of the first or the second subsegments (2a, 2b) of the first module segment (3a) or the first or the second subsegment (2c, 3d) of the second module segment (3b) are arranged parallel to the short edge.

7. The solar cell module as claimed in claim 4, wherein
   the solar cell strings (1) of one of the first and second subsegments (2) of one of the first and the second module segments (3a, 3b) comprises an identical number of solar cells (8) as the solar cell strings (1) of the further ones of the first and second subsegments (2) of the first and second module segments (3), and
   the first and the second module segments (3a, 3b) connected via the at least one segment connector (7) comprises an identical number of solar cell strings (1) and the solar cell strings (1) each comprise the identical number of solar cells (8).

8. The solar cell module as claimed in claim 1, wherein
   the first and the second subsegments of one of the first or the second module segments (3a, 3b) lie in a plane, and the first and the second bypass elements of the respective module segment are arranged spaced apart from the plane.

9. The solar cell module as claimed in claim 1, further comprising at least one module segment stack comprising a plurality of module segments, which includes at least the first and the second module segments (3a, 3b), arranged vertically in layers such so that the solar cells (8) of the first module segment (3a) and the solar cells (8) of the second module segment (3b) are arranged one over another.

10. The solar cell module as claimed in claim 9, further comprising a module segment stack connector for electrically conductively connecting at least two module segments of the plurality of module segments that are oriented adjacent to one another in a longitudinal arrangement which is perpendicular to an alignment of the solar cell string (1) extension direction.

11. The solar cell module as claimed in claim 1, wherein the first and the second subsegments (2a, 2b) of the first module segment (3a) are arranged parallel and adjacent to one another and are electrically connected in series by the subsegment connector (6a) of the first module segment (3a) in a first peripheral area.

12. The solar cell module as claimed in claim 1, wherein at least one of
a) the first and the second bypass connector (5a, 5b) have a length less than 250 cm, or
b) the first and the second bypass connector (5a, 5b) have a length greater than 30 cm.

13. The solar cell module as claimed in claim 1, wherein the first or the second bypass connector (5a, 5b) lies in a first plane and the respective solar cells (8) of a respective one of the module segments (3) lie in a second plane, which is spaced apart from the first plane, and
the respective module segment (3) is the first module segment (3a) if the first bypass connector (5a) lies in the first plane or is the second module segment (3b) if the second bypass connector (5b) lies in the first plane.

14. The solar cell module as claimed in claim 1, wherein at least one of
the solar cells (8) or the solar cell module (3) has a rectangular shape having an aspect ratio greater than one.

15. The solar cell module as claimed in claim 1, wherein further comprising
a third module segment (3c) arranged between the first and the second module segments (3a, 3b), and
first, second, third, and fourth pairs of subsegments arranged parallel to one another, the first pair comprises the first subsegment (2a) of the first module segment (3a) and a third subsegment (2c) of the first module segment (3a), the second pair comprises a first subsegment (2d) of the third module segment (3c) and the second subsegment (2b) of the first module segment (3a), the third pair comprises a second subsegment (2g) of the third module segment (3c) and the first subsegment (2e) of the second module segment (3b), and the fourth pair comprises a third subsegment (2h) of the second module segment (3b) and the second subsegment (2f) of the second module segment (3b),
wherein the first and the second module segments (3a, 3b) each comprise a third bypass element and the third module segment (3c) comprises a first bypass element and a second bypass element,
wherein the first, the second, and the third bypass elements of the first module segment (3a) are arranged between the first and the second subsegment pairs,
wherein the first and the second bypass elements of the third module segment (3c) are arranged between the first the second subsegments of the third module segment (3c), and
wherein the first, the second, and the third bypass elements of the second module segment (3b) are arranged between the third and the fourth subsegment pairs.

16. The solar cell module as claimed in claim 1, further comprising
one mirror plane, wherein at least a spatial arrangement of all of the solar cells of the solar cell module and all of the bypass elements of the solar cell module is formed mirror symmetrically to the mirror plane.

* * * * *